United States Patent
Yasuda et al.

(10) Patent No.: US 8,022,419 B2
(45) Date of Patent: Sep. 20, 2011

(54) FLIP-CHIP TYPE SEMICONDUCTOR LIGHT-EMITTING DEVICE, METHOD FOR MANUFACTURING FLIP-CHIP TYPE SEMICONDUCTOR LIGHT-EMITTING DEVICE, PRINTED CIRCUIT BOARD FOR FLIP-CHIP TYPE SEMICONDUCTOR LIGHT-EMITTING DEVICE, MOUNTING STRUCTURE FOR FLIP-CHIP TYPE SEMICONDUCTOR LIGHT-EMITTING DEVICE, AND LIGHT-EMITTING DIODE LAMP

(75) Inventors: Takaki Yasuda, Chiba (JP); Hideki Tomozawa, Ichihara (JP)

(73) Assignee: Showa Denko K.K., Tokyo (JP)

( * ) Notice: Subject to any disclaimer, the term of this patent is extended or adjusted under 35 U.S.C. 154(b) by 472 days.

(21) Appl. No.: 12/095,480

(22) PCT Filed: Dec. 19, 2006

(86) PCT No.: PCT/JP2006/325689
§ 371 (c)(1),
(2), (4) Date: May 29, 2008

(87) PCT Pub. No.: WO2007/072967
PCT Pub. Date: Jun. 28, 2007

(65) Prior Publication Data
US 2009/0159902 A1   Jun. 25, 2009

Related U.S. Application Data

(60) Provisional application No. 60/753,392, filed on Dec. 27, 2005.

(30) Foreign Application Priority Data

Dec. 19, 2005 (JP) .................................. 2005-364388
Mar. 29, 2006 (JP) .................................. 2006-090728
Apr. 20, 2006 (JP) .................................. 2006-116627

(51) Int. Cl.
*H01L 33/00* (2010.01)
(52) U.S. Cl. ............................... 257/88; 257/91; 438/28
(58) Field of Classification Search .................... 257/88, 257/91, 99; 438/28, 34
See application file for complete search history.

(56) References Cited

U.S. PATENT DOCUMENTS

| 6,483,196 | B1 | 11/2002 | Wojnarowski et al. | |
| 7,285,801 | B2 * | 10/2007 | Eliashevich et al. | 257/96 |
| 2004/0227148 | A1 * | 11/2004 | Camras et al. | 257/99 |

(Continued)

FOREIGN PATENT DOCUMENTS

JP   03-255640 A   11/1991

(Continued)

*Primary Examiner* — Kiesha Bryant
*Assistant Examiner* — Mark Tornow
(74) *Attorney, Agent, or Firm* — Sughrue Mion, PLLC

(57) ABSTRACT

A flip-chip type semiconductor light-emitting device having a positive electrode and a negative electrode similar in electrode area and capable of preventing the misalignment of the light-emitting device by utilizing the self alignment effect in manufacturing a light-emitting diode lamp and a printed circuit board for the flip-chip type semiconductor light-emitting device are provided. Furthermore, adopted are a flip-chip type semiconductor light-emitting device 1 which is provided with a negative electrode pad and a positive electrode pad formed on the side opposite the transparent substrate side of the semiconductor layer, wherein each of the electrode pads is formed in the same shape as each other and a printed circuit board for the light-emitting device has a pair of the electrode patterns which are formed in the same shape as each other. Still furthermore, a soldering film is included in each of the electrode pads.

18 Claims, 18 Drawing Sheets

U.S. PATENT DOCUMENTS

2004/0256631 A1* 12/2004 Shin .............................. 257/99
2006/0001035 A1* 1/2006 Suehiro et al. ................. 257/91

FOREIGN PATENT DOCUMENTS

| | | |
|---|---|---|
| JP | 2003-282945 A | 10/2003 |
| JP | 2004-266296 A | 9/2004 |
| JP | 2005-19939 A | 1/2005 |
| JP | 2005-209733 A | 8/2005 |
| JP | 2005-217331 A | 8/2005 |
| JP | 2005-268431 A | 9/2005 |

* cited by examiner

FLIP-CHIP TYPE SEMICONDUCTOR LIGHT-EMITTING DEVICE, METHOD FOR MANUFACTURING FLIP-CHIP TYPE SEMICONDUCTOR LIGHT-EMITTING DEVICE, PRINTED CIRCUIT BOARD FOR FLIP-CHIP TYPE SEMICONDUCTOR LIGHT-EMITTING DEVICE, MOUNTING STRUCTURE FOR FLIP-CHIP TYPE SEMICONDUCTOR LIGHT-EMITTING DEVICE, AND LIGHT-EMITTING DIODE LAMP

CROSS REFERENCE TO RELATED APPLICATIONS

Priority is claimed on Japanese Patent Application No. 2005-364338, filed Dec. 19, 2005, Japanese Patent Application No. 2006-090728, filed Mar. 29, 2006, and Japanese Patent Application No. 2006-116627, filed Apr. 20, 2006. This application is an application filed under 35 U.S.C. §111(a) claiming pursuant to 35 U.S.C. §119(e) of the filing date of Provisional Application 60/753,392 on Dec. 27, 2005, pursuant to 35 U.S.C. §111(b).

TECHNICAL FIELD

The present invention relates to a flip-chip type semiconductor light-emitting device, a method for manufacturing the flip-chip type semiconductor light-emitting device, a printed circuit board for the flip-chip type semiconductor light-emitting device, a mounting structure for the flip-chip type semiconductor light-emitting device and a light-emitting diode lamp, and in particular relates to technologies for preventing misalignment in mounting the flip-chip type semiconductor light-emitting device on a substrate.

BACKGROUND ART

A flip-chip structure in which electronic components such as ICs are bonded to a printed pattern on a substrate via solder balls or gold (Au) balls has attracted attention because it is free of a wire for obtaining electric conductivity unlike a face-up structure and is able to load a small-size electronic component by a relatively simple process (for example, refer to Patent Document 1). Therefore, the structure has been considered for possible applications to a light-emitting diode lamp equipped with semiconductor light-emitting devices.

FIG. 11A is a bottom view showing a conventional flip-chip type semiconductor light-emitting device, and FIG. 11B is a sectional pattern diagram corresponding to the line k-k' given in FIG. 11A. As shown in FIG. 11B, a conventional flip-chip type semiconductor light-emitting device 101 (hereinafter referred to as light-emitting device 101) is substantially constituted of a sapphire substrate 102, a semiconductor layer 103 stacked on the substrate 102, a positive electrode 104 provided on the semiconductor layer 103 and a negative electrode 105 provided at a site where the semiconductor layer 103 is partially removed by etching.

The semiconductor layer 103 formed on the substrate 102 is constituted by sequentially laminating a buffer layer 103a composed of aluminum nitride, an n-GaN layer 103b, a lower cladding layer 103c composed of n-GaN, an active layer (light-emitting layer) 103d which is to act as a well layer of a single quantum well structure, an upper cladding layer 103e composed of p-AlGaN, and a contact layer 103f composed of p-GaN. A recess 103g for fixing the negative electrode is formed at a part of the semiconductor layer 103 by removing the lower cladding layer 103c, the active layer (light-emitting layer) 103d, the upper cladding layer 103e and the contact layer 103f until exposure of the n-GaN layer 103b.

The positive electrode 104 is constituted of a first electrode layer 104a in which Pt film (thickness of 2 nm), ANC film (thickness of 60 nm) and Rh film (thickness of 30 nm) are stacked sequentially, a second electrode layer 104b in which Pt film (thickness of 2 nm) and Rh film (thickness of 120 nm) are stacked sequentially and a third electrode layer 104c in which Cr film (thickness of 40 nm), Ti film (thickness of 100 nm) and Au film (thickness of 200 nm) are stacked sequentially. Then, an ohmic junction is formed between the first electrode layer 104a and the semiconductor layer 103 (contact layer 103f).

Furthermore, the negative electrode 105 is constituted of an electrode layer 105a in which the Cr film (thickness of 40 nm), Ti film (thickness of 100 nm) and Au film (thickness of 200 nm) are stacked sequentially. The negative electrode 105 is, as described above, arranged on the recess 103g for fixing the negative electrode. Then, an ohmic junction is formed between the electrode layer 105a and the semiconductor layer 103 (n-GaN layer 103b).

Then, the conventional light-emitting device 101 is designed to radiate light mainly from the active layer (light-emitting layer) 103d to the substrate 102 side. As shown in FIG. 11A, the positive electrode 104 is formed substantially all over the semiconductor layer 103. This is because light from the light-emitting layer 103d is effectively reflected by the positive electrode 104 to radiate the light to the substrate 102 side and also electric current is allowed to flow effectively to p-type semiconductor layers (upper cladding layer 103e and contact layer 103f) which are relatively low in electric conductivity.

On the other hand, as shown in FIG. 11A, the electrode area of the negative electrode 105 is approximately one tenth that of the positive electrode 104. This is because the negative electrode 105 is bonded to an n-type semiconductor layer (n-GaN layer 103b) which has relatively high electric conductivity, thereby making it possible for electric current to flow effectively despite a small forming region of the negative electrode 105.

This light-emitting device 101 is fixed to a printed circuit board, and the substrate 102 side is placed upward, and used as a light-emitting diode lamp. FIG. 12 is a plan pattern diagram showing a printed circuit board which is used to mount a light-emitting diode lamp. The printed circuit board 110 illustrated in FIG. 12 is substantially constituted of an aluminum substrate 110a, an insulating layer 110b composed of a resin layer stacked on the aluminum substrate 110a, an electrode 111 for the positive electrode composed of Cu foil formed on the insulating layer 110b and an electrode 112 for the negative electrode. The electrodes 111 and 112 respectively for the positive electrode and the negative electrode are shaped so as to correspond respectively to the positive electrode 104 and the negative electrode 105 of the light-emitting device 101 when viewed from above.

Furthermore, printed patterns 111a and 112b are provided on the electrodes 111 and 112, respectively.

FIG. 13 illustrates a light-emitting diode lamp 120 wherein a light-emitting device 101 is packaged on a printed circuit board 110. As shown in FIG. 13, the light-emitting device 101 is arranged in such a manner that the positive electrode 104 and the negative electrode 105 face the printed circuit board 110. A soldering film 121 composed of AuSn for bonding is interposed between the positive electrode 104 and the electrode 111 of the printed circuit board 110. Furthermore, a soldering film 122 composed of AuSn for bonding is also interposed between the negative electrode 105 and the electrode 112. As described above, the light-emitting device 101 is soldered to the printed circuit board 110, thereby providing a flip-chip structure. In the light-emitting diode lamp 120 illustrated in FIG. 13, since an aluminum substrate 110a constituting the printed circuit board 110 is excellent in heat dissipation, heat generated in association with motions of the light-emitting device 101 can be effectively released via the printed circuit board 110.

In assembling the light-emitting diode lamp 120, first, AuSu alloy particle-containing soldering paste is coated respectively on the positive electrode 104 and the negative electrode 105 of the light-emitting device 101 in such a manner that the electrodes 104 and 105 are superimposed respectively on the electrodes 111 and 112 of the printed circuit board 110, and arranged and fixed temporarily. Then, the light-emitting device 101 and the printed circuit board 110 are charged into a furnace to effect re-flow, and AuSn alloy particles are melted and then solidified, by which soldering films 121 and 122 are formed to bond the electrodes 104 and 105 with the electrodes 111 and 112 of the printed circuit board 110, respectively. Thereby, the light-emitting diode lamp 120 is manufactured.

Patent Document 1 Japanese Published Unexamined Patent Application No. 3-255640.

DISCLOSURE OF INVENTION

In manufacturing the light-emitting diode lamp illustrated in FIG. 13, at the time of re-flow, AuSn alloy (eutectic solder) is melted and liquefied, and the light-emitting device 101 is kept floated on the thus liquefied eutectic solder. In this instance, since the area of the positive electrode 104 of the light-emitting device 101 is larger than that of the negative electrode 105, the light-emitting device is drawn near to the electrode 111 side for a positive electrode in a floating state, due to the surface tension of the melted eutectic solder. Thereafter, when the eutectic solder is solidified, the light-emitting device 101 results in bonding with the printed circuit board 110, while it is drawn nearer to the electrode 111 side for a positive electrode.

As described so far, the light-emitting device 101 results in bonding with the printed circuit board 110, which is, however, deviated from a target site in design, due to a difference in area between the electrodes 104 and 105 of the light-emitting device 101. In some instances, there is concern that the negative electrode 105 smaller in area could not be bonded to the electrode 112 for a negative electrode.

Furthermore, in manufacturing the light-emitting diode lamp illustrated in FIG. 13, soldering particles heated and melted at the time of re-flow are liquefied and may be oozed out from respective spaces between the electrodes 104, 105 of the light-emitting device 101 and the electrodes 111, 112 of the printed circuit board 110. In this instance, soldering films 121 and 122 interposed respectively between the electrodes 104, 105 of the light-emitting device 101 and the electrodes 111, 112 of the printed circuit board 110 will be given a very poor finish. Furthermore, since the above-described soldering paste is difficult to coat on the electrodes 104 and 105 of the light-emitting device 101 and easily dries up, it must be subjected to the re-flow process immediately after coating, which is disadvantageous.

The present invention has been made in view of the above circumstances, an object of which is to provide a flip-chip type semiconductor light-emitting device capable of preventing misalignment of a light-emitting device in manufacturing the light-emitting diode lamp by making equal the electrode area of pads for mounting the flip-chip type light-emitting device and utilizing self alignment, a method for manufacturing the flip-chip type semiconductor light-emitting device, a mounting structure of the flip-chip type semiconductor light-emitting device and a light-emitting diode lamp.

Another object of the present invention is to provide a flip-chip type semiconductor light-emitting device capable of improving the finish of a soldering film interposed between each electrode pad of the semiconductor light-emitting device and electrode patterns of a printed circuit board in conducting flip-chip mounting by placing a semiconductor light-emitting device on the printed circuit board and a method for mounting the flip-chip type semiconductor light-emitting device.

Still another object of the present invention is to provide a printed circuit board for the flip-chip type semiconductor light-emitting device capable of preventing misalignment of a light-emitting device in manufacturing a light-emitting diode lamp by utilizing self alignment.

In order to accomplish the above objects, a first aspect of the present invention uses the following constitutions.

(1) A flip-chip type semiconductor light-emitting device including a transparent substrate, a semiconductor layer in which an n-type semiconductor layer, a light-emitting layer and a p-type semiconductor layer are sequentially stacked on the transparent substrate, a negative electrode bonded with the n-type semiconductor layer formed on the side opposite the transparent substrate side of the semiconductor layer, a positive electrode formed on the side opposite the transparent substrate side of the semiconductor layer, bonded with the p-type semiconductor layer and larger in electrode area than the negative electrode, and a positive electrode pad and a negative electrode pad respectively connected to the positive electrode and the negative electrode, wherein each of the electrode pads is formed in the same shape as each other, when viewed from above.

(2) The flip-chip type semiconductor light-emitting device according to the preceding section (1), wherein the negative electrode pad is formed from a forming region of the negative electrode to a partial forming region of the positive electrode, and a short-circuit preventing insulator film is provided between the negative electrode pad and the positive electrode.

(3) The flip-chip type semiconductor light-emitting device according to the preceding section 2, wherein a recess penetrating the light-emitting layer and the p-type semiconductor layer to expose partially the n-type semiconductor layer is provided on the side opposite the transparent substrate side of the semiconductor layer, the negative electrode is bonded with the thus exposed n-type semiconductor layer, the positive electrode is bonded with the p-type semiconductor layer, and the positive electrode pad is formed at a remaining portion of forming the positive electrode.

(4) The flip-chip type semiconductor light-emitting device according to the preceding section 1, wherein a recess penetrating the light-emitting layer and the p-type semiconductor layer to partially expose the n-type semiconductor layer is provided at a plurality of sites on the side opposite the transparent substrate side of the semiconductor layer, a plurality of the negative electrodes are individually bonded with the n-type semiconductor layer exposed from each of the recesses, a plurality of the positive electrodes are bonded with the p-type semiconductor layer adjacent to each of the recesses, the electrode pads are respectively formed across a forming region of a plurality of negative electrodes and a forming region of a plurality of positive electrodes, and a short-circuit preventing insulator film is provided respectively between the positive electrode pad and the negative electrode and between the negative electrode pad and the positive electrode.

(5) The flip-chip type semiconductor light-emitting device according to any of the preceding sections 2 to 4, wherein the short-circuit preventing insulator film is formed on all of the positive electrode, the negative electrode and the semiconductor layer, the insulator film is provided with an aperture for connecting the negative electrode to the negative electrode pad, and also provided with another aperture for connecting the positive electrode to the positive electrode pad.

(6) The flip-chip type semiconductor light-emitting device according to any of the preceding sections 1 to 5, wherein soldering particles-containing soldering paste is coated respectively on the positive electrode pad and the negative electrode pad.

(7) The flip-chip type semiconductor light-emitting device according to any of the preceding sections 1 to 6, wherein a soldering film is included respectively in the positive electrode pad and the negative electrode pad.

(8) With regard to a semiconductor light-emitting device including a transparent substrate, a semiconductor layer in which an n-type semiconductor layer, a light-emitting layer and a p-type semiconductor layer are sequentially stacked on the transparent substrate, a negative electrode formed on the side opposite the transparent substrate side of the semiconductor layer and bonded with the n-type semiconductor layer, and a positive electrode formed on the side opposite the transparent substrate side of the semiconductor layer, bonded with the p-type semiconductor layer and larger in electrode area than the negative electrode, a method for manufacturing a flip-chip type semiconductor light-emitting device, wherein a short-circuit preventing insulator film is formed at least partially on a forming region of the positive electrode, a negative electrode pad is formed from a forming region of the negative electrode across a forming region of the insulator film, the negative electrode pad is connected to the negative electrode, and a positive electrode pad which is formed in the same shape as the negative electrode pad is connected to the positive electrode.

(9) The method for manufacturing the flip-chip type semiconductor light-emitting device according to the preceding section 8, wherein a recess penetrating the light-emitting layer and the p-type semiconductor layer to partially expose the n-type semiconductor layer is provided on the side opposite the transparent substrate side of the semiconductor layer, the negative electrode is bonded with the thus exposed n-type semiconductor layer, the positive electrode is bonded with the p-type semiconductor layer, and the positive electrode pad is formed on a remaining portion of the forming region of the positive electrode.

(10) The method for manufacturing the flip-chip type semiconductor light-emitting device according to the preceding section 8, wherein a recess penetrating the light-emitting layer and the p-type semiconductor layer to partially expose the n-type semiconductor layer is provided at a plurality of sites on the side opposite the transparent substrate side of the semiconductor layer, a plurality of the negative electrodes are individually bonded with the n-type semiconductor layer exposed from each of the recesses, a plurality of the positive electrodes are bonded with the p-type semiconductor layer adjacent to each of the recesses, the short-circuit preventing insulator film is formed on the semiconductor layer, a plurality of the positive electrodes and a plurality of the negative electrodes, the insulator film is provided with a plurality of apertures to partially expose a plurality of the negative electrodes and a plurality of the positive electrodes, the positive electrode pad and the negative electrode pad are formed respectively across a forming region of a plurality of the negative electrodes and a forming region of a plurality of the positive electrodes, the positive electrode pad is connected to the positive electrode and the negative electrode is connected to the positive electrode respectively via the apertures, and the insulator film is used to insulate respectively a space between the positive electrode pad and the negative electrode and a space between the negative electrode pad and the positive electrode.

(11) A mounting structure of a flip-chip type semiconductor light-emitting device which is provided with the flip-chip type semiconductor light-emitting device described in any of (1) through (7) and a printed circuit board having electrode patterns corresponding respectively to the positive electrode pad and the negative electrode pad of the flip-chip type semiconductor light-emitting device, wherein the positive electrode pad and the negative electrode pad are connected to each of the electrode patterns.

(12) The mounting structure of the flip-chip type semiconductor light-emitting device according to the preceding section 11, wherein a plurality of the flip-chip type semiconductor light-emitting devices are connected in series.

(13) A light-emitting diode lamp which is provided with the mounting structure described in either the preceding section 11 or the preceding section 12.

Furthermore, in order to resolve the above-described disadvantage, the present inventors actively studied to find that in conducting flip-chip mounting by placing a semiconductor light-emitting device on a printed circuit board, a soldering film for bonding is formed on a positive electrode pad and a negative electrode pad of the semiconductor light-emitting device and flux paste for temporary fixture is coated on electrode patterns of the printed circuit board, thereby improving the finish of the soldering film interposed between each of the electrode pads and the electrode patterns after re-flow, thus leading to completion of the present invention.

More specifically, a second aspect of the present invention provides the following means.

(a1) A flip-chip type semiconductor light-emitting device including a transparent substrate, a semiconductor layer in which an n-type semiconductor layer, a light-emitting layer and a p-type semiconductor layer are stacked sequentially on the transparent substrate, a negative electrode formed on the side opposite the transparent substrate side of the semiconductor layer and bonded with the n-type semiconductor layer, a positive electrode formed on the side opposite the transparent substrate side of the semiconductor layer and bonded with the p-type semiconductor layer, and a positive electrode pad and a negative electrode pad respectively connected to the positive electrode and the negative electrode, wherein a soldering film is included respectively in the positive electrode pad and the negative electrode.

(a2) The flip-chip type semiconductor light-emitting device according to the preceding section (a1), wherein the positive electrode pad and the negative electrode pad are in the same shape as each other, when viewed from above.

(a3) A method for mounting the flip-chip type semiconductor light-emitting device described in either the preceding section (a1) or the preceding section (a2), wherein flux paste is coated on each electrode pattern of the printed circuit board provided with electrode patterns corresponding respectively to the positive electrode pad and the negative electrode pad, the semiconductor light-emitting device is arranged on the printed circuit board in such a manner that the positive electrode pad and the negative electrode pad are superimposed respectively on each of the electrode patterns and temporarily fixed with the flux paste, the soldering film is then melted and solidified by re-flow, thereby bonding the positive electrode pad and the negative electrode pad respectively with the electrode patterns.

(a4) The method for mounting the flip-chip type semiconductor light-emitting device described in the preceding section (a3), wherein a soldering film is formed on each of the electrode patterns and the flux paste is coated on the soldering film.

(a5) The method for mounting the flip-chip type semiconductor light-emitting device described in either the preceding section (a3) or the preceding section (a4), wherein soldering particles are included in the flux paste.

(a6) A mounting structure of the flip-chip type semiconductor light-emitting device, which is provided with the flip-chip type semiconductor light-emitting device described in either the preceding section (a1) or the preceding section (a2) and a printed circuit board having electrode patterns corresponding respectively to the positive electrode pad and the negative electrode pad of the semiconductor light-emitting device, wherein the semiconductor light-emitting device is arranged on the printed circuit board in such a manner that the positive electrode pad and the negative electrode pad are superimposed respectively on the electrode patterns, and the positive electrode pad and the negative electrode pad are bonded with the respective electrode patterns via a soldering film formed by melting and solidifying the soldering film.

(a7) A light-emitting diode lamp which is provided with the mounting structure described in the preceding section (a6).

Furthermore, in order to accomplish the above-described objective, a third aspect of the present invention uses the following constitutions.

(b1) A printed circuit board for a flip-chip type semiconductor light-emitting device, which is provided with a transparent substrate, a semiconductor layer stacked on the transparent substrate and a negative electrode pad and a positive electrode pad formed on the side opposite the transparent substrate side of the semiconductor layer, wherein the flip-chip type semiconductor light-emitting device in which the electrode pads are formed in the same shape as each other, when viewed from above, is packaged on a printed circuit board, a pair of electrode patterns to which each of the electrode pads is connected on mounting and a printed pattern connected to the electrode pattern are provided, and a pair of the electrode patterns are formed in the same shape as each other, when viewed from above.

(b2) The printed circuit board for the flip-chip type semiconductor light-emitting device described in the preceding section (b1), wherein a plurality of printed patterns are connected to one of the electrode patterns and a step portion for exposing the edge face of the printed pattern is provided at a portion connecting the electrode pattern with the printed pattern.

(b3) The printed circuit board for the flip-chip type semiconductor light-emitting device described in the preceding section (b2), wherein a plurality of the printed patterns are formed approximately in a linear manner and each of the printed patterns is drawn from a pair of the electrode patterns in a direction different from each other.

(b4) The printed circuit board for the flip-chip type semiconductor light-emitting device described in any of the preceding sections (b1) to (b3), wherein the printed pattern is formed approximately in a linear manner and the printed pattern is 500 µm or lower in line width.

(b5) A mounting structure of the flip-chip type semiconductor light-emitting device including a printed circuit board in which the flip-chip type semiconductor light-emitting device described in any of the preceding sections (b1) to (b4) is packaged, a transparent substrate, a semiconductor layer stacked on the transparent substrate, a negative electrode pad and a positive electrode pad formed on the side opposite the transparent substrate side of the semiconductor layer, wherein the flip-chip type semiconductor light-emitting device in which the electrode pads are formed in the same shape as each other, when viewed from above is provided, and the positive electrode pad and the negative electrode pad are connected to each of the electrode patterns of the printed circuit board.

(b6) A light-emitting diode lamp which is provided with the mounting structure described in the preceding section (b5).

According to the flip-chip type semiconductor light-emitting device (light-emitting device) of the present invention, since each of the electrode pads fixed to a positive electrode and a negative electrode is formed in the same shape, in a re-flow process for mounting a light-emitting device on a printed circuit board, there is no concern that the light-emitting device may be drawn to one bonding pad side, while it is floated, even when the light-emitting device is kept floated on liquefied solder, thereby making it possible to bond the light-emitting device with the printed circuit board at a target site in design accurately. More specifically, since each of the electrode pads is formed in the same shape, the self alignment effect is provided on flip-chip connection, thereby making it possible to bond the light-emitting device at a target site accurately.

Furthermore, according to a method for manufacturing the light-emitting device of the present invention, each of the electrode pads fixed to a positive electrode and a negative electrode can be formed in the same shape, thereby making it possible to manufacture easily the light-emitting device in which the self alignment effect can be exerted on flip-chip connection.

Still furthermore, according to a mounting structure for the light-emitting device of the present invention, since each of the electrode pads provided on the light-emitting device is formed in the same shape and the shape of the electrode on the printed circuit board corresponds to the shape of each of the electrode pads, the self alignment effect can be exerted on flip-chip connection, thereby making it possible to provide a mounting structure in which the light-emitting device is bonded at a target site accurately.

In addition, in the present invention, when flip-chip mounting is conducted by placing a semiconductor light-emitting device on a printed circuit board, a soldering film for bonding is formed on a positive electrode pad and a negative electrode pad of the semiconductor light-emitting device and flux paste for temporary fixture is coated on an electrode pattern side of the printed circuit board, thereby making it possible to improve the finish of the soldering film interposed between each of the electrode pads and the electrode patterns after re-flow.

BRIEF DESCRIPTION OF THE DRAWINGS

FIG. 1 are views showing a flip-chip type semiconductor light-emitting device, which is a first embodiment of the present invention, in which

FIG. 2 are process drawings describing a method for manufacturing the flip-chip type semiconductor light-emitting device, which is the first embodiment of the present invention, in which

FIG. 3 are views showing a light-emitting diode lamp provided with the flip-chip type semiconductor light-emitting device described in the first embodiment of the present invention, in which

FIG. 4 are views showing a flip-chip type semiconductor light-emitting device which is a second embodiment of the present invention, in which

FIG. 5 are views showing a flip-chip type semiconductor light-emitting device, which is a third embodiment of the present invention, in which

FIG. 6 are process drawings describing a method for manufacturing a flip-chip type semiconductor light-emitting device which is a third embodiment of the present invention, in which

FIG. 7 are process drawings describing the method for manufacturing the flip-chip type semiconductor light-emitting device which is the third embodiment of the present invention, in which

FIG. 8 are process drawings describing the method for manufacturing the flip-chip type semiconductor light-emitting device which is the third embodiment of the present invention, in which

FIG. 9 are views showing a light-emitting diode lamp, which is a fourth embodiment of the present invention, in which

FIG. 10 are views showing a light-emitting diode lamp which is a fifth embodiment of the present invention, in which

FIG. 11 are views showing a conventional flip-chip type semiconductor light-emitting device, in which

FIG. 12 are views showing a substrate for the conventional light-emitting diode lamp, in which

FIG. 14 are views showing a printed circuit board which is a sixth embodiment of the present invention, in which

FIG. 15 are views showing a state at which a light-emitting device is packaged on the printed circuit board which is the sixth embodiment of the present invention, in which

FIG. 16 are views showing a printed circuit board which is a seventh embodiment of the present invention, in which

FIG. 17 are views showing a state at which a light-emitting device is packaged on the printed circuit board which is the seventh embodiment of the present invention, in which

FIG. 18 are views showing a light-emitting diode lamp which is an eighth embodiment of the present invention, in which FIG. 19 are views showing a light-emitting diode lamp which is a ninth embodiment of the present invention, in which

DESCRIPTION OF SYMBOLS IN THE ABOVE FIGURES 1, 21, 31, 42, 52, and 81: light-emitting device (flip-chip type semiconductor light-emitting device)
2, 32: transparent substrate
3, 33: semiconductor layer
3b, 33b, . . . n-GaN layer (n-type semiconductor layer, exposed portion of n-type semiconductor layer)
3c, 33c: lower cladding layer (n-type semiconductor layer)
3d, 33d: active layer (light-emitting layer)
3e, 33e: upper cladding layer (p-type semiconductor layer)
3f, 33f: contact layer (p-type semiconductor layer)
3g, 33g: notched portion (recess)
4, 34: positive electrode
5, 35: negative electrode
6, 26, 36: insulator film (short-circuit preventing insulator film)
6a: through hole (another aperture)
6b: through hole (aperture)
7, 37: positive electrode pad
8, 38: negative electrode pad
10, 43, 53, 80: printed circuit board
10c, 20c, 43d, 53d: electrode pattern
11, 20, 41, 51: light-emitting diode lamp (mounting structure of light-emitting device)
33A: n-type semiconductor layer
33B: light-emitting layer
33C: p-type semiconductor layer
33g: recess 36b: notched portion (aperture)
36a: through hole (another aperture)
44, 54: cover plate
46, 47, 56, 57: stacked layer
53b, 54b: insulated resin film
$20d_1$: edge face
20e: connected portion
20f: step portion
$w_1$: line width of printed pattern

BEST MODE FOR CARRYING OUT THE INVENTION

Figure 1A:
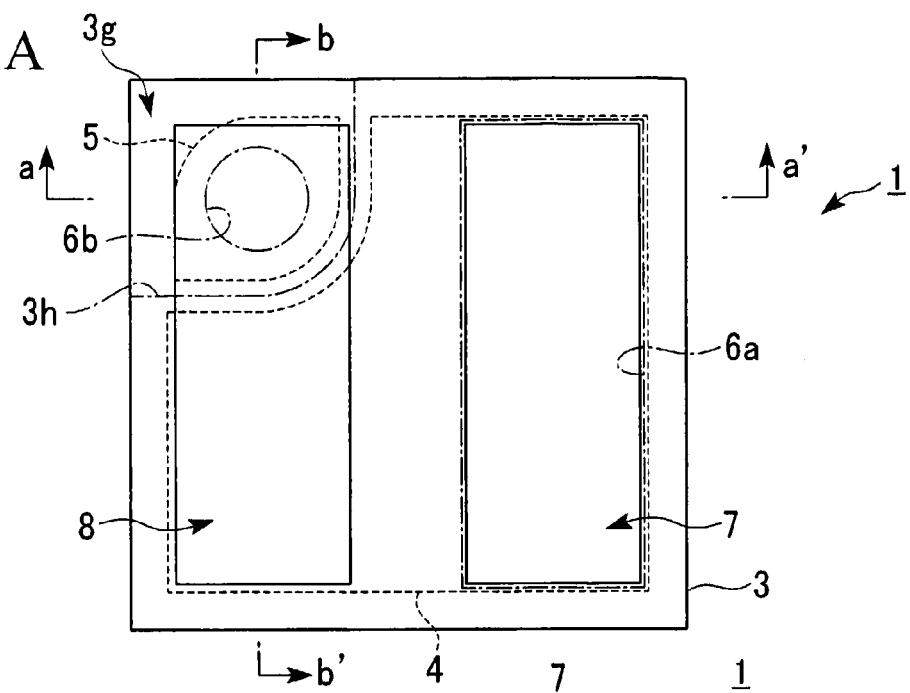
FIG. 1A is a bottom view, (1B) is a sectional pattern diagram corresponding to the line a-a' of FIG. 1A.

Hereinafter, a description will be made of embodiments of the present invention by referring to the drawings. It should be noted that the drawings referred to in the following description are for describing a flip-chip type semiconductor light-emitting device, the manufacturing method thereof, a mounting structure of the flip-chip type semiconductor light-emitting device and a constitution of the light-emitting diode lamp, and the size, thickness, dimension, etc., of illustrated portions may be different from those of an actual flip-chip type semiconductor light-emitting device and others.

First Embodiment

Figure 1B:
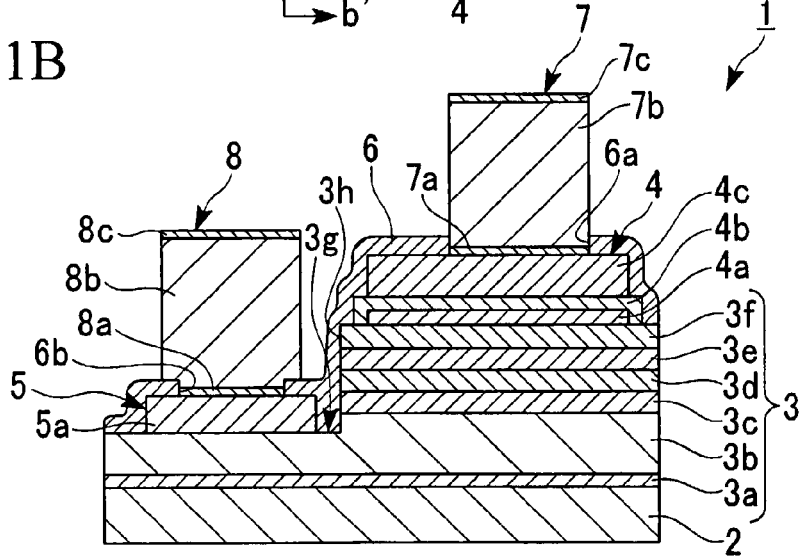
Figure 1C:
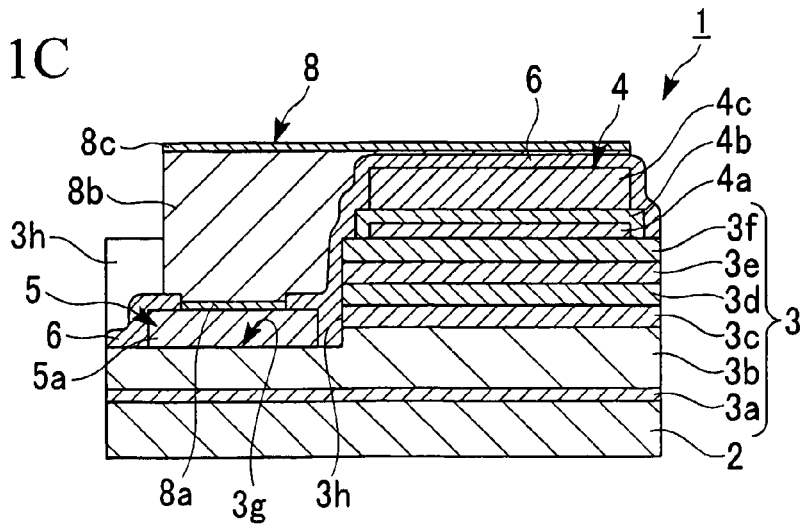
FIG. 1C is a sectional pattern diagram corresponding to the line b-b' of FIG. 1A.

FIG. 1A is a bottom view showing the flip-chip type semiconductor light-emitting device of the present embodiment, FIG. 1B is a sectional pattern diagram corresponding to the line a-a' of FIG. 1A, and FIG. 1C is a sectional pattern diagram corresponding to the line b-b' of FIG. 1A.

As illustrated from FIG. 1A to FIG. 1C, a flip-chip type semiconductor light-emitting device 1 of the present embodiment (hereinafter referred to as light-emitting device 1) is called a gallium nitride type semiconductor light-emitting device, which is approximately rectangular when viewed from above, and constituted substantially of a transparent substrate 2 approximately rectangular when viewed from above, a semiconductor layer 3 approximately rectangular when viewed from above and stacked on the transparent substrate 2, a positive electrode 4 and a negative electrode 5 formed on the side opposite the transparent substrate 2 side of the semiconductor layer 3, a short-circuit preventing insulator film 6, a positive electrode pad 7 connected to the positive electrode 4 and a negative electrode pad 8 connected to the negative electrode 5.

The transparent substrate 2 is a plate-like member having a length of one side from approximately 150 μm to 1000 μm and a thickness from approximately 50 μm to 100 μm and usually made with sapphire for a gallium nitride type semiconductor light-emitting device. It is to be noted that the transparent substrate 2 is not necessarily made with sapphire but may be made with any optimal materials, depending on the type of the light-emitting device.

The semiconductor layer 3 is constituted of a plurality of layers stacked on the transparent substrate 2, which are roughly classified into a p-type semiconductor layer, a light-emitting layer and an n-type semiconductor layer. More specifically, the semiconductor layer 3 is constituted of a buffer layer 3a composed of aluminum nitride, an n-GaN layer 3b (n-type semiconductor layer), a lower cladding layer 3c (n-type semiconductor layer) composed of n-GaN, an active layer (light-emitting layer) 3d which is to act as a well layer of a single quantum well structure, an upper cladding layer 3e (p-type semiconductor layer) composed of p-AlGaN, and a contact layer 3f (p-type semiconductor layer) composed of p-GaN sequentially from the substrate 2.

Furthermore, a notched portion 3g (recess) at which the n-GaN layer 3b (n-type semiconductor layer) is exposed by a partial removal of the contact layer 3f, the upper cladding layer 3e (they are both p-type semiconductor layers) and the active layer 3d (light-emitting layer) (penetrated) is provided on the side opposite the transparent substrate 2 side of the semiconductor layer 3. As shown in FIG. 1A, the notched portion 3g is provided in the vicinity of one corner among four corners of the semiconductor layer 3 which is approximately rectangular when viewed from above, and the area when viewed from above is a size of half to one-nineteenth of a whole area of the semiconductor layer 3 when viewed from above.

Then, as shown in FIG. 1B and FIG. 1C, the positive electrode 4 is formed on the contact layer 3f which is opposite the transparent substrate 2 of the semiconductor layer 3. Furthermore, the positive electrode 4 is, as shown in FIG. 1A, formed at a part other than a forming region of the notched portion 3g.

The positive electrode 4 is constituted of a first electrode layer 4a on which Pt film (thickness of 2 nm), AgNdCu film (thickness of 60 nm) and Rh film (thickness of 30 nm) are sequentially stacked, a second electrode layer 4b on which Pt film (thickness of 2 nm) and Rh film (thickness of 120 nm) are sequentially stacked, and a third electrode layer 4c on which Cr film (thickness of 40 nm), Ti film (thickness of 100 nm) and Au film (thickness of 200 nm) are sequentially stacked. Then, an ohmic junction is formed between the first electrode layer 4a and the semiconductor layer 3 (contact layer 3f).

Then, as shown in FIG. 1B and FIG. 1C, the negative electrode 5 is formed on the n-GaN layer 3b exposed by the notched portion 3g. Furthermore, as shown in FIG. 1A, the negative electrode 5 is formed inside a forming region of the notched portion 3g.

The negative electrode 5 is constituted of an electrode layer 5a on which Cr film (thickness of 40 nm), Ti film (thickness of 100 nm) and Au film (thickness of 200 nm) are stacked sequentially. Then, an ohmic junction is formed between the electrode layer 5a and the semiconductor layer 103 (n-gGaN layer 103b).

As shown in FIG. 1A, the electrode area of the negative electrode 5 is a size of half to one-nineteenth of that of the positive electrode 4. As described above, the electrode area of the positive electrode 4 is made larger because light from the light-emitting layer 3d is effectively reflected by the positive electrode 4 in such a manner that the light can be radiated to the substrate 2 side and electric current is also allowed to flow effectively through p-type semiconductor layers (upper cladding layer 3e and contact layer 3f) relatively low in electric conductivity. On the other hand, the negative electrode 5 may be made smaller because the negative electrode 5 is bonded with the n-type semiconductor layer (n-GaN layer 3b) relatively high in electric conductivity and electric current is able to flow effectively despite a small forming region of the negative electrode 5.

Then, a short-circuit preventing insulator film 6 is formed on the side opposite the transparent substrate 2 side of the semiconductor layer 3. The insulator film 6 is formed in such a manner as to cover respectively the parts of a contact layer 3f, and an n-GaN layer 3b exposed from a notched portion 3g, a positive electrode 4 and a negative electrode 5. Furthermore, the insulator film 6 is formed so as to cover a notched face 3h as well. The notched face 3h is a face dividing the notched portion 3g and intersecting with the transparent substrate 2 in the substrate surface direction. The insulator film 6 is provided with an approximately rectangular through hole 6a (aperture) for partially exposing the positive electrode 4 and an approximately circular through hole 6b (aperture) for partially exposing the negative electrode 5.

The insulator film 6 is constituted of $SiO_2$ film, for example, with a thickness from approximately 50 nm to 300 nm.

Then, a positive electrode pad 7 is formed on the through hole 6a of the insulator film 6. The positive electrode pad 7 is formed so as to be partially inserted into the through hole 6a and bonded with the positive electrode 4 exposed by the through hole 6a. The through hole 6a and the positive electrode pad 7 are made similar in dimension, by which the positive electrode 4 is substantially completely covered by the insulator film 6 at the boundary between the through hole 6a and the positive electrode pad 7. Furthermore, as shown in FIG. 1A, the positive electrode pad 7 is formed on a forming region of the positive electrode 4. It is to be noted that the forming region of the positive electrode 4 is a region where the positive electrode is formed when the positive electrode 4 is viewed from the side opposite the transparent substrate 1 (side given in FIG. 1A).

The positive electrode pad 7 is constituted of a first metal film 7a as a barrier layer having a thickness of approximately 20 nm formed on the positive electrode 4, a soldering film 7b having a thickness of approximately 1 μm formed on the first metal film 7a and a second metal film 7c as a soldering oxidation preventive layer having a thickness of approximately 20 nm formed on the soldering film 7b. The first metal film 7a is constituted of Ni, for example, the soldering film 7b is constituted of a single metal or a soldering alloy having a melting temperature of 400° C. or less, more specifically, constituted of AuSn alloy, for example. The second metal film 7c is constituted of Au, for example.

On the other hand, a negative electrode pad 8 is formed on the through hole 6b of the insulator film 6. The negative electrode pad 8 is formed so as to be partially inserted into the through hole 6b and bonded with the negative electrode 5 exposed by the through hole 6b. Furthermore, as illustrated in FIG. 1A, the negative electrode pad 8 is formed at least across a forming region of the negative electrode 5 and a forming region of the positive electrode 4, and also formed larger than the negative electrode 5. As shown in FIG. 1C, an insulator film 6 is arranged at a part where the negative electrode pad 8 is superimposed on the positive electrode 4, and the insulator film 6 acts to insulate the negative electrode pad 8 from the positive electrode 4. Furthermore, the forming region of the negative electrode 5 is a region where the negative electrode is formed when the negative electrode 5 is viewed from the side opposite the transparent substrate 1 (side given in FIG. 1A).

The negative electrode pad 8 is constituted of a first metal film 8a as a barrier layer having a thickness of approximately 20 nm formed on the negative electrode 5, a soldering film 8b having a thickness of approximately 3 μm formed on the first metal film 8a and the insulator film 6 and a second metal film 8c as a soldering oxidation preventive layer having a thickness of approximately 20 nm formed on the soldering film 8b. The first metal film 8a is constituted of Ni, for example, the soldering film 8b is constituted of a single metal or a soldering alloy having a melting temperature of 400° C. or less, more specifically, constituted of AuSn alloy, for example. The second metal film 8c is constituted of Au, for example.

Furthermore, as shown in FIG. 1A, the positive electrode pad 7 and the negative electrode pad 8 are approximately rectangular when viewed from above and also formed in the same shape as each other. Still furthermore, when the light-emitting device 1 is viewed from the side opposite the transparent substrate 2, the positive electrode pad 7 and the negative electrode pad 8 are positioned so as to be symmetrical to each other. The positive electrode pad 7 and the negative electrode pad 8 are arranged with a predetermined interval therebetween, and these pads 7 and 8 are also arranged in such a manner that their longer sides face each other. In addition, when each of the electrode pads 7 and 8 is viewed from the forming region of the positive electrode 4 and from the forming region of the negative electrode 5, the negative electrode pad 8 is formed substantially in almost all forming region of the negative electrode 5 and partially in the forming region of the positive electrode 4, and the positive electrode pad 7 is formed at a remaining portion of the forming region of the positive electrode 4, which is their positional relationship.

Furthermore, soldering paste which contains soldering particles in flux paste may be coated on the positive electrode pad 7 and the negative electrode pad 8. The soldering particles are preferably constituted of a single metal or a soldering alloy having a melting temperature of 400° C. or less, more specifically, with AuSn alloy, for example.

FIG. 2 illustrates a method for manufacturing the light-emitting device 1 of the present embodiment.

Figure 2A:
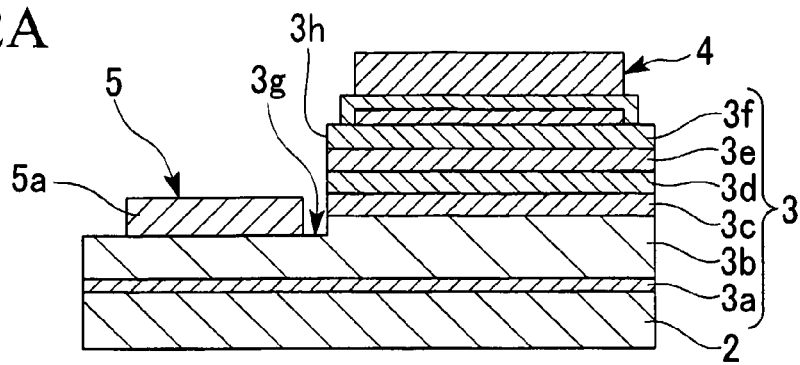
FIG. 2A to FIG. 2D are sectional process drawings corresponding to FIG. 2B.

First, as shown in FIG. 2A, a semiconductor layer 3 is formed by sequentially laminating layers from a buffer layer 3a to a contact layer 3f on a transparent substrate 2, the semiconductor layer 3 is partially etched to provide a notched portion 3g, a negative electrode 5 is formed on an n-GaN layer 3b exposed from the notched portion 3g, and the positive electrode 4 is formed on the contact layer 3f.

Figure 2B:
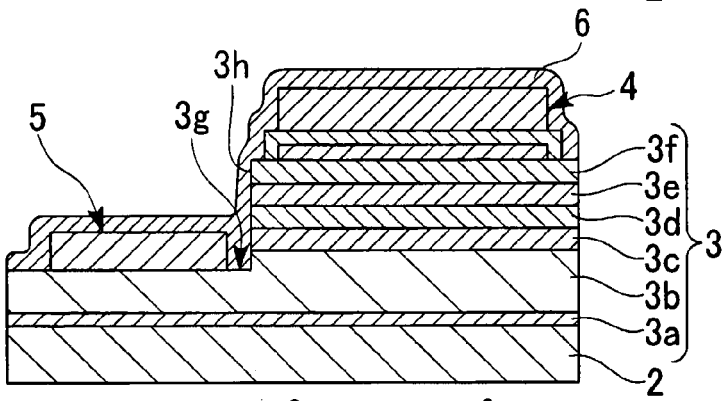

As shown in FIG. 2B, an insulator film 6 composed of short-circuit preventing $SiO_2$ is then formed so as to cover the semiconductor layer 3, the positive electrode 4 and the negative electrode 5. The insulator film 6 may be desirably formed by using the sputtering process or plasma CVD process, for example.

Figure 2C:
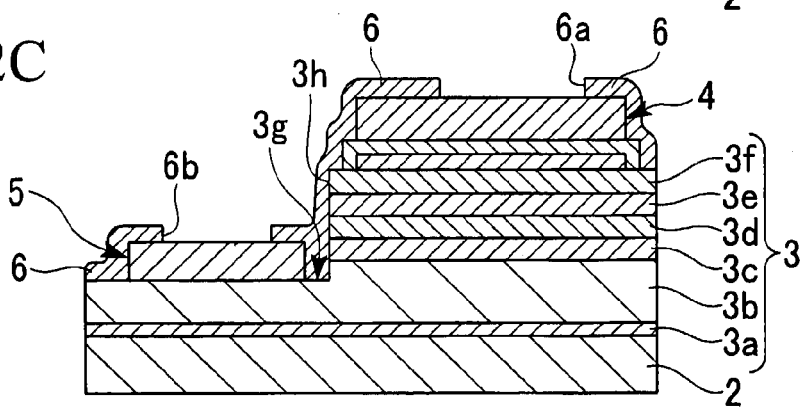

As shown in FIG. 2C, through holes 6a and 6b are formed on the insulator film 6. The through hole 6a is provided on the positive electrode 4 so that the positive electrode 4 can be partially exposed. Furthermore, the through hole 6b is provided on the negative electrode 5 so that the negative electrode 5 can be partially exposed.

Figure 2D:
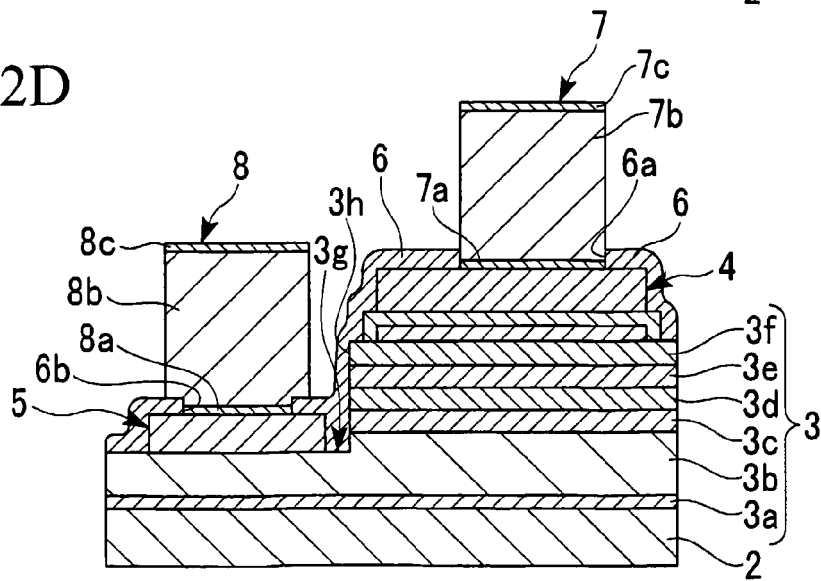

As shown in FIG. 2D, a first metal film 7a, a soldering film 7b and a second metal film 7c are sequentially stacked on the positive electrode 4 exposed from the through hole 6a to form a positive electrode pad 7. Furthermore, a first metal film 8a, a soldering film 8b and a second metal film 8c are sequentially stacked on the negative electrode 5 exposed from the through hole 6b to form a negative electrode pad 8. The negative electrode pad 8 is formed from a forming region of the negative electrode 5 across the forming region of the positive electrode 4. Since the insulator film 6 is stacked on the positive electrode 4, it is possible to prevent a short circuit between the negative electrode pad 8 and the positive electrode 4.

In the light-emitting device 1 of the present embodiment, the positive electrode pad 7 for mounting is connected to the positive electrode 4, the negative electrode pad 8 for mounting is connected to the negative electrode 5, the short-circuit preventing insulator film 6 is arranged between the negative electrode pad 8 and the positive electrode 4, by which the negative electrode pad 8 can be made larger than the negative electrode 5, allowing the shape of the negative electrode 8 when viewed from above to coincide with that of the positive electrode pad 7 when viewed from above. Thereby, the self alignment effect can be exerted in mounting the light-emitting device 1.

Furthermore, according to the light-emitting device 1 of the present embodiment, the short-circuit preventing insulator film 6 is arranged between the negative electrode pad 8 and the positive electrode 4, by which a short circuit between the negative electrode pad 8 and the positive electrode 4 can be prevented and the negative electrode pad 8 can be expanded up to a forming region of the positive electrode 4, resulting in an increased degree of freedom in shaping the negative electrode pad 8 and the positive electrode pad 7.

Still furthermore, according to the light-emitting device 1 of the present embodiment, a notched portion 3g is provided at a part of the semiconductor layer 3, by which the negative electrode 5 and the negative electrode pad 8 can be arranged on the side opposite the transparent substrate 2 side and at the same time the positive electrode pad 7 can also be arranged on the side opposite the transparent substrate 2 side, thereby in mounting the light-emitting device 1 on a printed circuit board or others, the positive electrode pad 7 and the negative electrode pad 8 can be packaged in the printed circuit board side to provide a flip-chip structure.

Figure 3A:
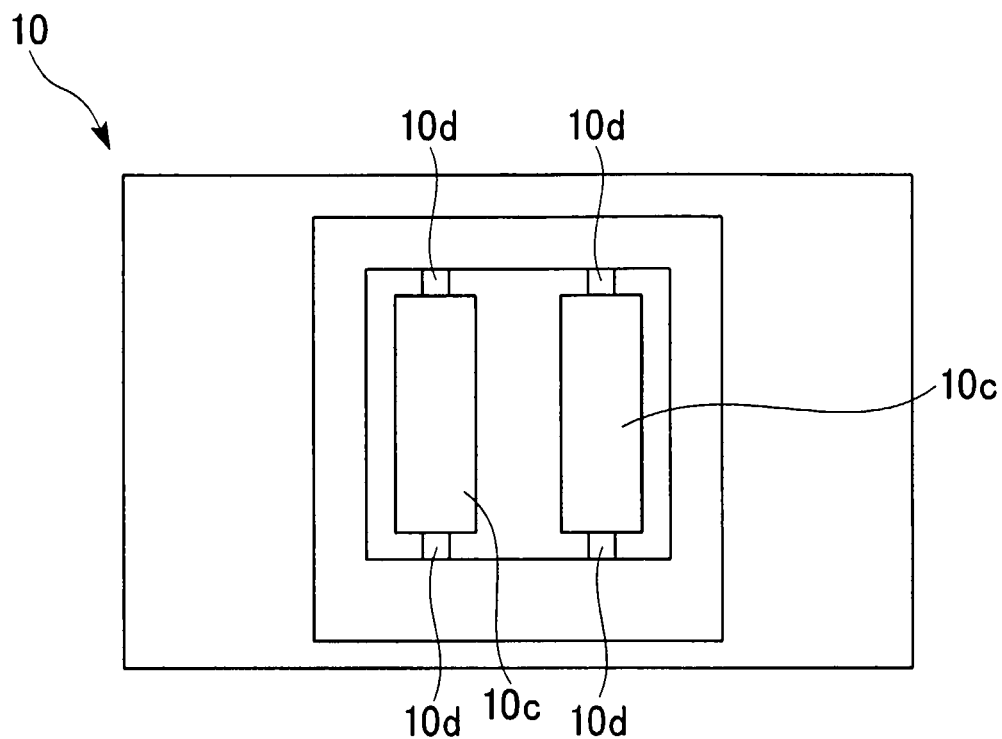
FIG. 3A is a plan pattern diagram of a substrate constituting the light-emitting diode lamp and FIG. 3B is a sectional pattern diagram of the light-emitting diode lamp.
Figure 3B:
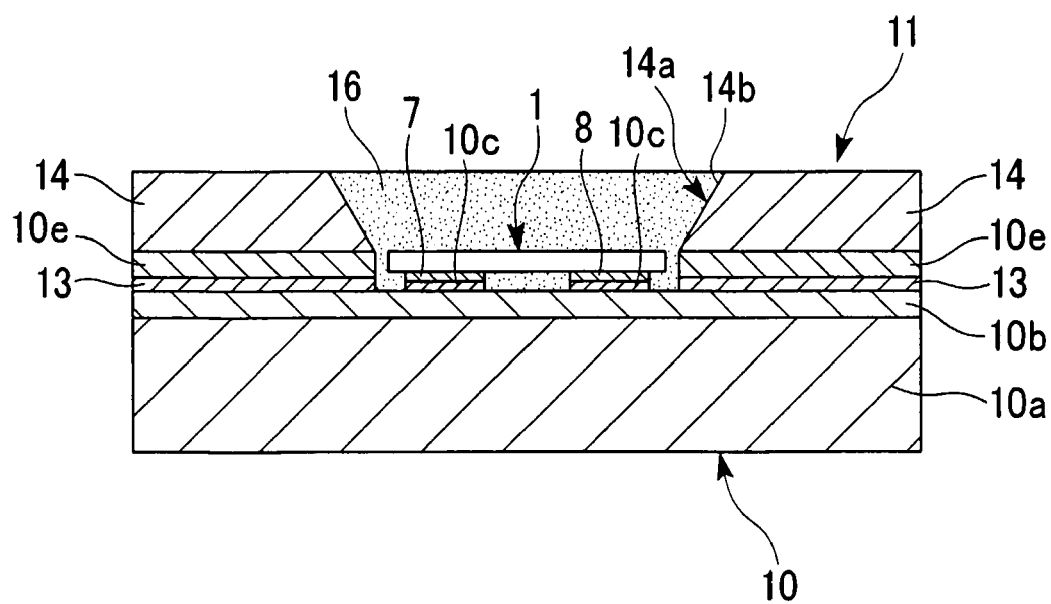

Next, FIG. 3A shows a plan pattern diagram of a printed circuit board for mounting the light-emitting device 1 of the present embodiment, and FIG. 3B illustrates a sectional pattern diagram of a light-emitting diode lamp provided with the light-emitting device 1 of the present embodiment.

As shown in FIG. 3A and FIG. 3B, the printed circuit board 10 is substantially constituted of a metal substrate 10a composed of aluminum, etc., an insulating layer 10b composed of a resin layer stacked on the metal substrate 10a and electrode patterns 10c and 10c composed of Cu foil formed on the insulating layer 10b.

The electrode patterns 10c are formed approximately in a rectangular shape when viewed from above, as with each of the pads 7 and 8 so as to correspond respectively to the positive electrode pad 7 and the negative electrode pad 8 of the light-emitting device 1 when viewed from above. Furthermore, the electrode patterns 10c and 10c are arranged, with rectangular longer-side portions facing each other at predetermined intervals, as with each of the pads 7 and 8, in such a manner that they correspond to the respective positions of forming the positive electrode pad 7 and the negative electrode pad 8 of the light-emitting device 1. Still furthermore, a printed pattern 10d is formed in continuation with each of the electrode patterns 10c and 10c. The printed pattern 10d is formed with Cu foil, as are the electrode patterns 10c and 10c.

In addition, a metal reflective member 14 is arranged on the printed circuit board 10. Another insulator film 10e is formed between the reflection member 14 and a printed pattern 13 of the printed circuit board.

The reflection member 14 is provided with a through hole 14a, and the electrode patterns 10c and 10c on the printed circuit board 10 are arranged inside the through hole 14a. The sidewall face of the through hole 14a is given as a tapered face 14b. The tapered face 14b is able to reflect light from the light-emitting device 1 effectively in mounting the light-emitting device 1, for example. Furthermore, a fluorescent substance-containing transparent resin 16 is filled in the through hole 14a. The transparent resin 16 is filled so as to completely bury the light-emitting device 14. The fluorescent substance-containing transparent resin 16 is filled in the through hole 14a to provide additive color effects of light. For example, in the case of a blue-light-emitting device, a yellow fluorescent substance-containing transparent resin 16 is filled in the through hole 14a to constitute a white-light-emitting diode lamp.

When the light-emitting device 1 of the present embodiment is packaged in the printed circuit board 10, first, flux paste (exclusively made with flux, the same will apply hereinafter) is thinly coated by a dispenser process or a printing process respectively on the electrode patterns 10c and 10c of the printed circuit board 10. Then, the light-emitting device 1 is arranged on the printed circuit board 10 in such a manner that the pads 7 and 8 are superimposed respectively on the electrode patterns 10c and 10c, and temporarily fixed by flux paste. Then, the light-emitting device 1 and the printed circuit board 10 are charged into a furnace to effect re-flow, and soldering films 7b and 8b constituting each of the pads 7 and 8 of the light-emitting device 1 are melted and then solidified, by which the pads 7 and 8 are respectively bonded with the electrode patterns 10c and 10c of the printed circuit board 10. Thereafter, a sealing resin is filled and cured to provide a light-emitting diode lamp 20.

As described so far, in a mounting structure for the flip-chip type semiconductor light-emitting device of the present invention, the light-emitting device 1 is arranged on the printed circuit board 10 in such a manner that the positive electrode pad 7 and the negative electrode pad 8 are superimposed on the respective electrode patterns 10c and 10c, and the positive electrode pad 7 and the negative electrode pad 8 are bonded with the respective electrode patterns 10c and 10c via a soldering film formed by melting and solidifying the soldering films 7b and 8b.

In manufacturing the light-emitting diode lamp 11 illustrated in FIG. 3B, soldering films 7b and 8b for bonding are formed on the positive electrode pad 7 and the negative electrode pad 8 of the light-emitting device 1, flux paste for temporary fixture is coated on the electrode patterns 10c and 10c of the printed circuit board 10 to effect re-flow, by which a bond portion of the light-emitting device 1 with the printed circuit board 10 is less likely to be smeared with excess solder and the like, and a better finish can be given to a soldering film (bond portion) interposed respectively between the electrode pads 7, 8 and the electrode patterns 10c, 10c after the re-flow. Furthermore, this eliminates the necessity of coating flux paste on the positive electrode pad 7 and the negative electrode pad 8 side of the light-emitting device 1, thereby making it possible to reduce the production cost.

In manufacturing the light-emitting diode lamp 11 shown in FIG. 3B, the soldering films 7b and 8b are melted and liquefied at the time of re-flow, and the light-emitting device 1 is kept floated in the thus liquefied solder.

In this instance, since the positive electrode pad 7 and the negative electrode pad 8 of the light-emitting device 1 are formed in the same shape and similar in area, the respective pads 7 and 8 of the light-emitting device 1 are positioned accurately on the electrodes 10c and 10c of the printed circuit board due to the surface tension of the thus melted solder. As described above, the self alignment effect is provided, thereby making it possible to bond the light-emitting device 1 with the printed circuit board 10 at a target position in design. Furthermore, the accuracy of placing the light-emitting device 1 on the printed circuit board 10 is dependent on accuracy of a mounting and assembly device, with the accuracy of approximately ±10 µm. The self alignment effect is provided as described in the present embodiment, thereby making it possible to attain a positional accuracy of approximately ±1 µm after the light-emitting device 1 is bonded and greatly increase the accuracy of mounting the light-emitting device 1.

Other than the above-described means, the following means (a) may also be used as means for mounting the light-emitting device 1 of the present embodiment on the printed circuit board 10.

(a) First, soldering particles-containing soldering flux paste is thinly coated by a dispenser process or a printing process respectively on the electrode patterns 10c and 10c of the printed circuit board 10. Then, the light-emitting device 1 is arranged on the printed circuit board 10 in such a manner that these pads 7 and 8 are superimposed respectively on the electrode patterns 10c and 10c, and fixed temporarily. Then, the light-emitting device 1 and the printed circuit board 10 are charged into a furnace to effect re-flow and soldering particles in soldering paste and soldering films 7b and 8b constituting each of the pads 7 and 8 are melted and then solidified, by which these pads 7 and 8 are respectively bonded with the electrode patterns 10c and 10c of the printed circuit board 10.

According to the above method, the printed circuit board 10 can be reliably bonded with the light-emitting device 1.

Furthermore, the following means (b) through (d) may be used as means for mounting the light-emitting device 1 of the present embodiment on the printed circuit board 10.

(b) First, a soldering film is formed on each of the electrode patterns 10c and 10c of the printed circuit board 10 by evaporation process or plating, and flux paste is then thinly coated on the soldering film by the dispenser process or printing process. Then, the light-emitting device 1 is arranged on the printed circuit board 10 in such a manner that the pads 7 and 8 are respectively superimposed on the electrode patterns 10c and 10c and fixed temporarily. Then, the light-emitting device 1 and the printed circuit board 10 are charged into a furnace to effect re-flow and the soldering film and soldering films 7b and 8b constituting these pads 7 and 8 are melted and then solidified, by which the pads 7 and 8 are respectively bonded with the electrode patterns 10c and 10c of the printed circuit board 10.

According to this method, as with the above-described method given in (a), the printed circuit board 10 can be reliably bonded with the light-emitting device 1.

(c) First, the positive electrode pad and the negative electrode pad of the light-emitting device 1 are respectively formed with a metal layer (for example, Au layer) alone. Soldering particles-containing soldering flux paste is thinly coated on each of the electrode patterns 10c and 10c of the printed circuit board 10 by the dispenser process or printing process. Then, the light-emitting device 1 is arranged on the printed circuit board 10 in such a manner that the pads of the light-emitting device 1 are superimposed respectively on the electrode patterns 10c and 10c, and fixed temporarily. Then, the light-emitting device 1 and the printed circuit board 10 are charged into a furnace to effect re-flow and soldering particles in the soldering flux paste are melted and then solidified, by which these pads 7 and 8 are respectively bonded with the electrode patterns 10c and 10c of the printed circuit board 10.

According to this method, soldering particles in the soldering flux paste coated on the electrode patterns are melted and the light-emitting device is floated on the thus melted solder. Therefore, as with the above instance, the self alignment effect is exerted to bond the light-emitting device 1 with the printed circuit board 10 at a target position in design.

(d) First, the positive electrode pad and the negative electrode pad of the light-emitting device 1 are respectively formed with a metal layer (for example, Au layer) alone. Then, flux paste is thinly coated on each of the pads. A soldering film is formed on each of the electrode patterns 10c and 10c of the printed circuit board 10 by evaporation process. Next, the light-emitting device 1 is arranged on the printed circuit board 10 in such a manner that the pads of the light-emitting device 1 are superimposed respectively on the electrode patterns 10c and 10c and fixed temporarily. Then, the light-emitting device 1 and the printed circuit board 10 are charged into a furnace to effect re-flow and the soldering film formed on the electrode pattern is melted and then solidified, by which the pads 7 and 8 are respectively bonded with the electrode patterns 10c and 10c of the printed circuit board 10.

According to this method, the soldering film formed on the electrode patterns is melted and the light-emitting device is floated on the thus melted solder. Therefore, as with the above instance, the self alignment effect is exerted to bond the light-emitting device 1 with the printed circuit board 10 at a target position in design.

Furthermore, in mounting the light-emitting device 1 of the present embodiment on the printed circuit board 10, the following mounting method of (e) or (f) may be used.

(e) First, a soldering film is formed on each of the electrode patterns 10c and 10c of the printed circuit board 10 by evaporation process, and soldering paste is then thinly coated on the soldering film by the dispenser process or printing process. Next, the light-emitting device 1 is arranged on the printed circuit board 10 in such a manner that these pads 7 and 8 are superimposed respectively on the electrode patterns 10c and 10c and fixed temporarily. Then, the light-emitting device 1 and the printed circuit board 10 are charged into a furnace to effect re-flow, and soldering particles in the soldering paste, the soldering film and soldering films 7b and 8b constituting the pads 7 and 8 are melted and then solidified, by which the pads 7 and 8 are respectively bonded with the electrode patterns 10c and 10c of the printed circuit board 10.

According to this method, as with the above-described method of (a), the printed circuit board 10 can be reliably and firmly bonded with the light-emitting device 1.

(f) First, the positive electrode pad and the negative electrode pad of the light-emitting device 1 are respectively formed with a metal layer (for example Au layer) alone. A low-melting point metal film (solder) composed of Sn, AuSn, etc., is formed on these electrode pads by evaporation process or plating process.

On the other hand, the electrode patterns 10c and 10c of the printed circuit board 10 are respectively formed by Cu or Ni/Au plating and the like, and flux paste is coated by the dispenser process or printing process so as to cover the electrode patterns 10c and 10c. Next, the light-emitting device 1 is arranged on the printed circuit board 10 in such a manner that the pads of the light-emitting device 1 are superimposed respectively on the electrode patterns 10c and 10c, and fixed temporarily. Then, the light-emitting device 1 and the printed circuit board 10 are charged into a furnace to effect re-flow, and the low-melting point metal film of the light-emitting device 1 is melted and then solidified, by which these pads 7 and 8 are respectively bonded with the electrode patterns 10c and 10c of the printed circuit board 10.

According to this method, the light-emitting device is floated on the flux paste coated on the electrode patterns. Therefore, as with the above instance, the self alignment effect is exerted to bond the light-emitting device 1 with the printed circuit board 10 at a target position in design.

Second Embodiment

Figure 4A:
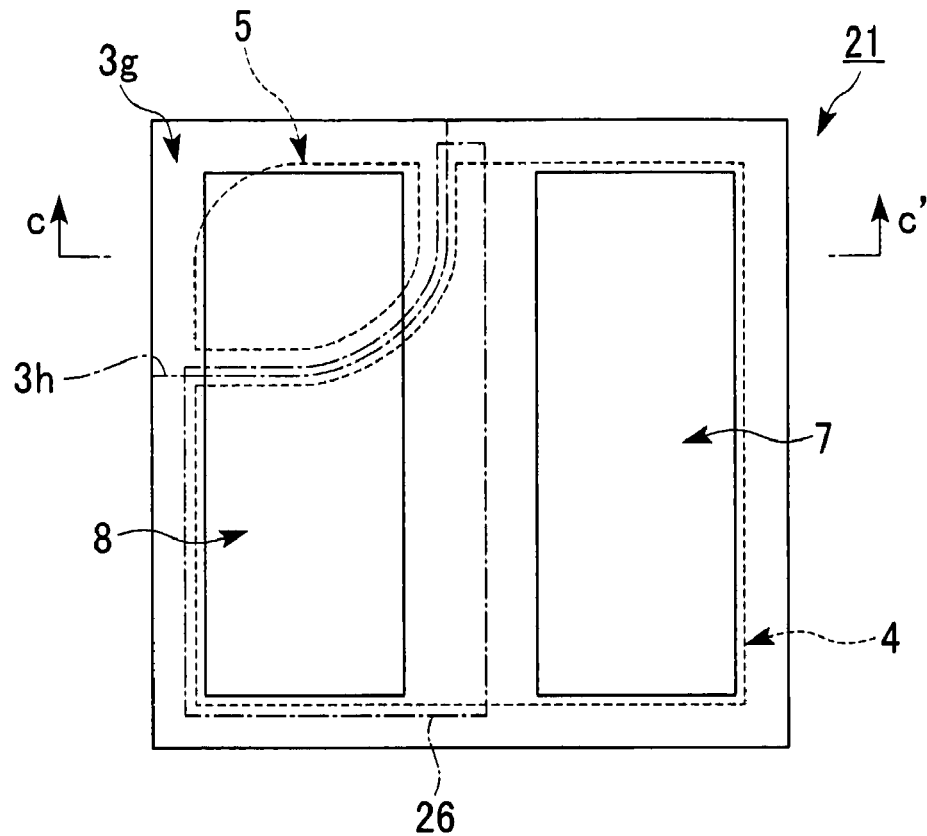
FIG. 4A is a bottom view and FIG. 4B is a sectional pattern diagram corresponding to the line c-c' of FIG. 4A.
Figure 4B:
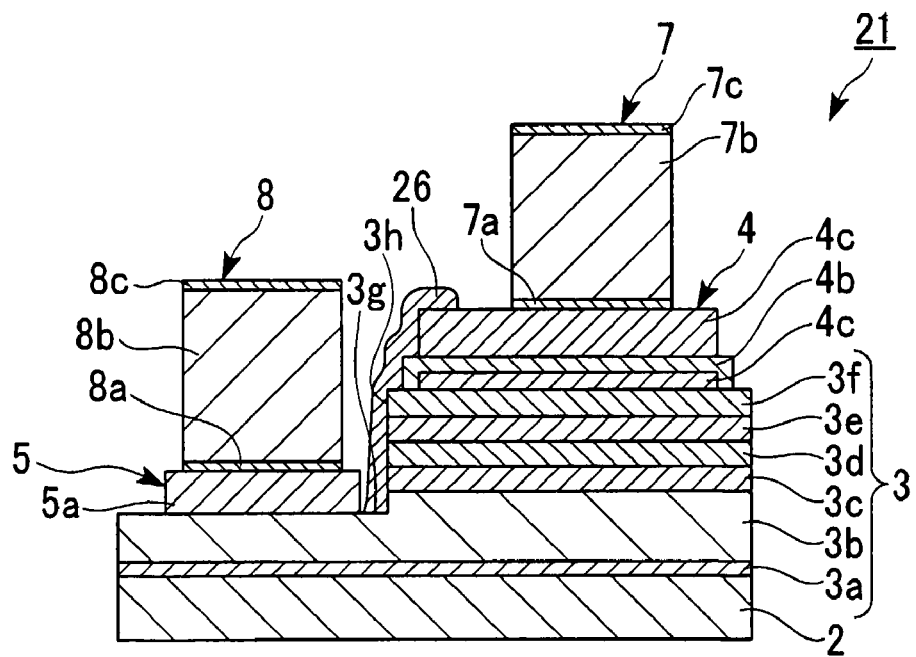

Next, a description will be given of a flip-chip type semiconductor light-emitting device which is a second embodiment of the present invention by referring to the drawings. FIG. 4A is a bottom view showing the flip-chip type semiconductor light-emitting device of the present embodiment, FIG. 4B is a sectional pattern diagram corresponding to the line c-c' of the FIG. 4A. It should be noted that of constituent features of the light-emitting device given in FIG. 4, the same constituent features as those of the light-emitting device 1 of the first embodiment given in FIG. 1 are given the same symbols or numerals as those given in FIG. 1 and a description will be given of briefly or omitted.

The light-emitting device of the present embodiment is different from the light-emitting device 1 of the first embodiment given in FIG. 1 in that the short-circuit preventing insulator film is different in the forming region.

That is, as shown in FIG. 4, the light-emitting device 21 of the present embodiment is constituted of a transparent substrate 2, a semiconductor layer 3, a positive electrode 4, a negative electrode 5, a short-circuit preventing insulator film 26, a positive electrode pad 7 and a negative electrode pad 8.

The insulator film 26 is formed on the side opposite the transparent substrate 2 side of the semiconductor layer 3. Furthermore, as shown in FIG. 4A, the insulator film 26 is formed so as to cover a part of the positive electrode 4 and a notched face 3h of a notched portion 3g. The insulator film 26 is constituted of $SiO_2$ film, for example, with the thickness ranging from approximately 50 nm to 300 nm.

Furthermore, the positive electrode pad 7 is formed at a portion not covered by the insulator film 26 of the positive electrode 4 (remaining portion of the positive electrode).

Still furthermore, the negative electrode pad 8 is formed at a portion including a forming region of the negative electrode 5 and that covered by the insulator film 26 of the positive electrode 4 (part of the positive electrode). The insulator film 26 is arranged at a portion where the negative electrode pad 8 is superimposed on the positive electrode 4, and the insulator film 26 insulates the negative electrode pad 8 from the positive electrode 4.

In addition, as with the first embodiment, the positive electrode pad 7 and the negative electrode pad 8 are formed approximately in a rectangular shape (rectangle) when viewed from above, as shown in FIG. 4A and also formed in the same shape as each other. When the light-emitting device 21 is viewed from the side opposite the transparent substrate 2, the positive electrode pad 7 and the negative electrode pad 8 are positioned to be symmetrical to each other. Furthermore, the positive electrode pad 7 and the negative electrode pad 8 are arranged with a predetermined interval therebetween, and also arranged in such a manner that longer sides of these pads 7 and 8 face each other.

Furthermore, as with the first embodiment, soldering particles-containing soldering paste may be coated on the positive electrode pad 7 and the negative electrode pad 8.

The light-emitting device 21 of the present embodiment can be manufactured similarly as in the first embodiment, except that the insulator film 26 is formed so as to cover a part of the positive electrode 4 and the notched face 3h of the notched portion 3g.

The light-emitting device 21 of the present embodiment is able to provide similar effects as those provided by the light-emitting device 1 of the first embodiment.

In conducting flip-chip mounting by placing the light-emitting device 21 of the present embodiment on the above printed circuit board 10, first, flux paste is thinly coated on each of the electrode patterns 10c and 10c of the printed circuit board 10 by the dispenser process or printing process. Next, the light-emitting device 21 is arranged on the printed circuit board 10 in such a manner that the pads 7 and 8 are superimposed respectively on the electrode patterns 10c and 10c, and fixed temporarily by using the flux paste. Then, the light-emitting device 21 and the printed circuit board 10 are charged into a furnace to effect re-flow, and soldering films 7b and 8b constituting the pads 7 and 8 of the light-emitting device 21 are melted and solidified to form a soldering film, by which these pads 7 and 8 are respectively bonded with the electrode patterns 10c and 10c of the printed circuit board 10.

In this instance as well, the soldering films 7b and 8b for bonding are formed on the positive electrode pad 7 and the negative electrode pad 8 side of the light-emitting device 21, flux paste for temporary fixture is coated on the electrode patterns 10c and 10c side of the printed circuit board 10 to effect re-flow, by which a bonded portion of the light-emitting device 21 with the printed circuit board 10 is less likely to be smeared with excess solder and the like, and a better finish can be given to a soldering film (bonded portion) interposed between the electrode pads 7 and 8 and the electrode patterns 10c and 10c after the re-flow. Furthermore, the necessity for coating flux paste on the positive electrode pad 7 and the negative electrode pad 8 side of the light-emitting device 21 is eliminated, thereby making it possible to reduce the production cost.

Therefore, the light-emitting device 21 of the present embodiment is also able to provide similar effects as those provided by the light-emitting device 1 of the first embodiment.

Furthermore, the above-described mounting methods of (a) through (f) may be used in mounting the light-emitting device 21 of the present embodiment on the printed circuit board 10.

Third Embodiment

Figure 5A:
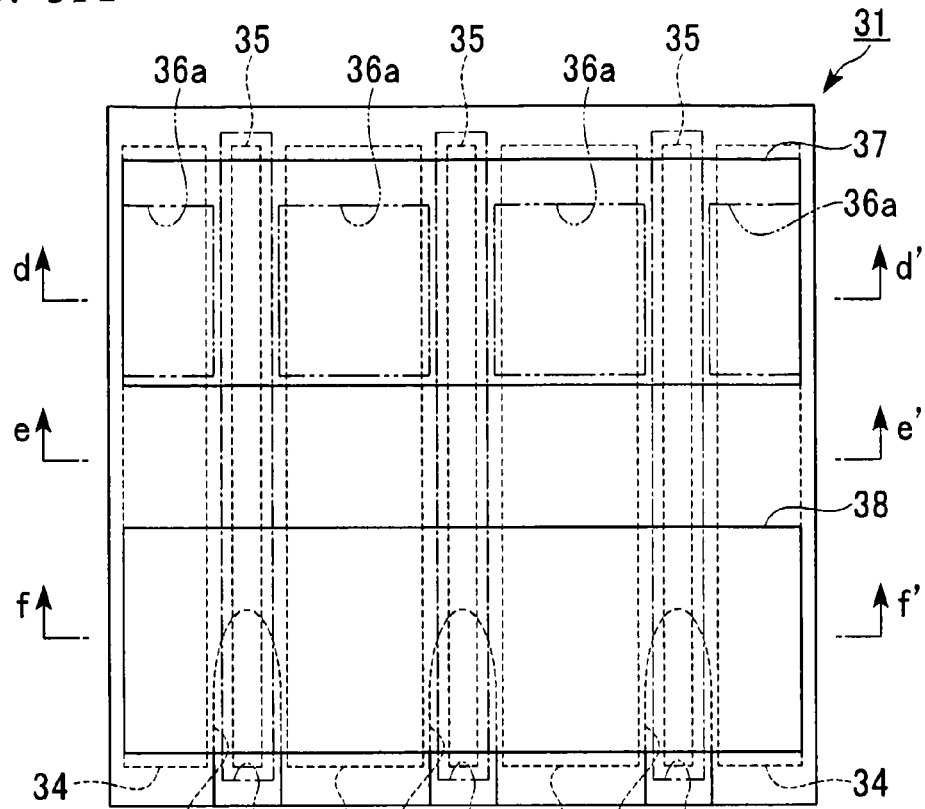
FIG. 5A is a bottom view.
Figure 5B:
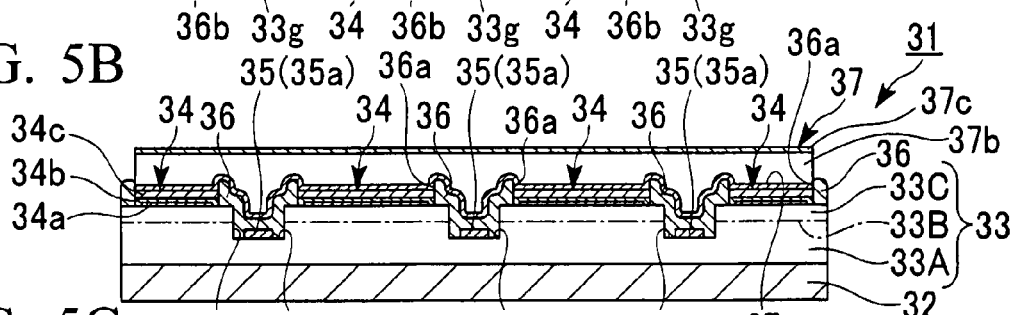
FIG. 5B is a sectional pattern diagram corresponding to the line d-d' of FIG. 5A.

Next, a description will be given of a third embodiment of the present invention by referring to the drawings. FIG. 5A is a bottom view showing the flip-chip type semiconductor light-emitting device of the present embodiment. FIG. 5B is a sectional pattern diagram corresponding to the line d-d' of FIG. 5A, FIG. 5C is a sectional pattern diagram corresponding to the line e-e' of FIG. 5A, and FIG. 5D is a sectional pattern diagram corresponding to the line f-f' of FIG. 5A.

As shown in FIG. 5A to FIG. 5D, the flip-chip type semiconductor light-emitting device 31 (hereinafter referred to as light-emitting device 31) of the present embodiment is called a gallium nitride type semiconductor light-emitting device which is approximately in a rectangular shape when viewed from above. It is substantially constituted of a transparent substrate 32 approximately rectangular when viewed from above, a semiconductor layer 33 approximately rectangular when viewed from above and stacked on the transparent substrate 32, a plurality of positive electrodes 34 and negative electrodes 35 formed on the side opposite the transparent substrate 32 side of the semiconductor layer 33, a short-circuit preventing insulator film 36, a positive electrode pad 37 connected to each of the positive electrodes 34 and a negative electrode pad 38 connected to each of the negative electrodes 35.

The transparent substrate 32 is a plate-like member having a length of one side from 500 μm to 2000 μm and a thickness from 50 μm to 100 μm, for example, and made usually with sapphire for a gallium nitride type semiconductor light-emitting device. Furthermore, the transparent substrate 32 is not necessarily made with sapphire but may be made with any appropriate materials, depending on the types of light-emitting devices.

Figure 5C:
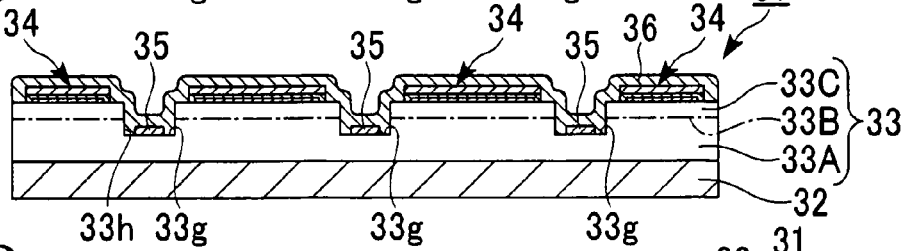
FIG. 5C is a sectional pattern diagram corresponding to the line e-e' of FIG. 5A.
Figure 5D:
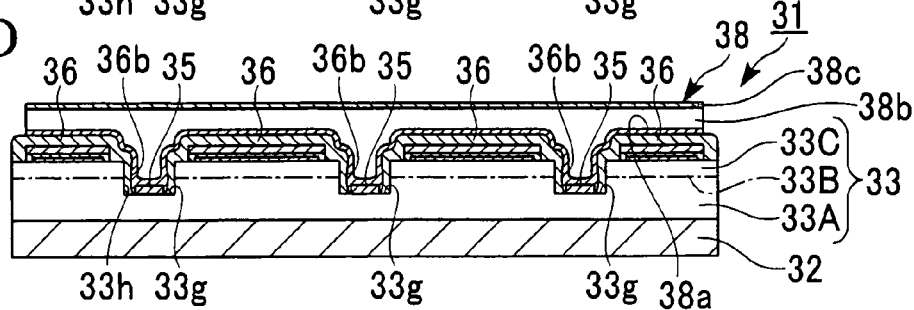
FIG. 5D is a sectional pattern diagram corresponding to the line f-f of FIG. 5A.

The semiconductor layer 33 is constituted of a plurality of layers stacked on the transparent substrate 32 and, as shown in FIG. 5B to FIG. 5D, roughly classified into an n-type semiconductor layer 33A, a light-emitting layer 33B and a p-type semiconductor layer 33C. In FIG. 5B to FIG. 5D, the layer indicated by a single dashed and dotted line is the light-emitting layer 33B, a layer between the light-emitting layer 33B and the transparent substrate 32 is the n-type semiconductor layer 33A, and a layer stacked on the upper side of the light-emitting layer 33B as shown in the drawing is the p-type semiconductor layer 33C. More specifically, the n-type semiconductor layer 33A is constituted by laminating sequentially an n-GaN layer and a lower cladding layer composed of n-GaN. Then, the active layer (light-emitting layer) 33B which is provided as a well layer of a single quantum well structure is stacked on the lower cladding layer. Furthermore, the p-type semiconductor layer 33C is constituted by laminating sequentially an upper cladding layer composed of p-AlGaN which is formed on the active layer 33B and a contact layer composed of p-GaN. Still furthermore, a buffer layer composed of aluminum nitride (not illustrated) is formed between the substrate 32 and the n-type semiconductor layer 33A.

A recess 33g penetrating the p-type semiconductor layer 33C and the light-emitting layer 33B to expose the n-GaN layer of the n-type semiconductor layer 33A is provided at a plurality of sites on the side opposite the transparent substrate 32 side of the semiconductor layer 33. Each of the recesses 33g is formed in a long rectangular shape when viewed from above, as shown in FIG. 5A, and arranged in the same direction at predetermined intervals. A total area of these recesses 33g when viewed from above is a size of half to one-nineteenth of a whole area of the semiconductor layer 33 when viewed from above.

Then, as shown in FIG. 5A to FIG. 5D, a positive electrode 34 is formed on the p-type semiconductor layer 33C which is opposite the transparent substrate 32 of the semiconductor layer 33. Furthermore, the positive electrode 34 is formed on both sides of the recess 33g. The positive electrode 34 is approximately in a rectangular shape when viewed from above, with the longer side running along the longitudinal direction of the recess 33g.

The positive electrode 34 is constituted of a first electrode layer 34a formed by laminating sequentially Pt film (thickness of 2 nm), AgNdCu film (thickness of 60 nm) and Rh film (thickness of 30 nm), a second electrode layer 34b formed by laminating sequentially Pt film (thickness of 2 nm) and Rh film (thickness of 120 nm) and a third electrode layer 34c formed by laminating sequentially Cr film (thickness of 40 nm), Ti film (thickness of 100 nm) and Au film (thickness of 200 nm). Then, an ohmic junction is formed between the first electrode layer 34a and the p-type semiconductor layer 33C.

Then, as shown in FIG. 5A to FIG. 5D, a negative electrode 35 is formed on the n-type semiconductor layer 33A (n-GaN layer) exposed in association with formation of the recess 33g. The negative electrode 35 is formed approximately in a rectangular shape when viewed from above, corresponding to the contour of the recess 33g.

The negative electrode 35 is constituted of an electrode layer 35a formed by laminating sequentially Cr film (thickness of 40 nm), Ti film (thickness of 100 nm) and Au film (thickness of 200 nm). Then, an ohmic junction is formed between the electrode layer 35a and the n-type semiconductor layer 33A (a-GaN layer).

As shown in FIG. 5A, a total electrode area of the negative electrode 35 is a size of half to one-nineteenth of a whole electrode area of the positive electrode 34. As described above, a whole electrode area of the positive electrode 34 is made larger because light from the light-emitting layer 33B is effectively reflected by the positive electrode 34 to radiate the light on the substrate 32 side and also electric current is allowed to flow effectively through the p-type semiconductor layer 33C which is relatively low in electric conductivity. On the other hand, the negative electrode 35 is made smaller because the negative electrode 35 is bonded with the n-type semiconductor layer 33A relatively high in electric conductivity and allows electric current to flow effectively despite a smaller forming region of the negative electrode 35.

Next, a short-circuit preventing insulator film 36 is formed on the side opposite the transparent substrate 32 side of the semiconductor layer 33. The insulator film 36 is formed so as to cover the semiconductor layer 33, the positive electrode 34 and the negative electrode 35. The insulator film 36 is formed so as to cover a notched face 33h as well. The notched face 33h is a sidewall face dividing the recess 33g and intersecting with the substrate face of the transparent substrate 32.

The insulator film 36 is provided with a plurality of approximately rectangular through holes 36a (aperture) for exposing partially each of the positive electrodes 34 and also approximately semi-oval notched portions 36b (aperture) for exposing partially each of the negative electrodes 35. The through hole 36a for exposing the positive electrode 34 is provided at one longitudinal end side of the positive electrode 34. Furthermore, the notched portion 36b for exposing the negative electrode 35 is on the side opposite a position at which the through hole 36a is formed, and provided on the other longitudinal end side of the negative electrode 35.

The insulator film 36 is constituted of $SiO_2$ film, for example, with the thickness ranged from 50 nm to 300 nm.

Next, as shown in FIG. 5A and FIG. 5B, a positive electrode pad 37 which is approximately rectangular when viewed from above is formed on the insulator film 36. The positive electrode pad 37 is placed in a direction at which the longitudinal direction intersects the longitudinal direction of the positive electrode 34 or the negative electrode 35. Thereby, the positive electrode pad 37 is formed across a forming region of the positive electrode 34 and a forming region of the negative electrode 35.

Furthermore, the positive electrode pad 37 and the positive electrode 34 are connected to each other via through holes 36a of the insulator film 36, whereas the positive electrode pad 37 is insulated from the negative electrode 35 by the insulator film 36.

The positive electrode pad 37 is constituted by laminating sequentially an Ni layer 37a with a thickness of approximately 20 nm as a barrier layer, a soldering film 37b with a maximum thickness of approximately 10 μm and an Au layer 37c with a thickness of approximately 20 nm as a soldering oxidation preventive layer. The soldering film 37b is constituted of a single metal or a soldering alloy having a melting temperature of 400° C. or less, more specifically, constituted of AuSn alloy, for example.

Then, as shown in FIG. 5A and FIG. 5D, a negative electrode pad 38 which is approximately rectangular when viewed from above is formed on the insulator film 36. The negative electrode pad 38 is, as with the positive electrode pad 37, placed in a direction at which the longitudinal direction intersects with the longitudinal direction of the positive electrode 34 or the negative electrode 35. Thereby, the negative electrode pad 38 is formed across a forming region of the positive electrode 34 and a forming region of the negative electrode 35. The negative electrode pad 38 and the negative electrode 35 are connected to each other via the notched portion 36b of the insulator film 36, whereas the negative electrode pad 38 is insulated from the positive electrode 34 by the insulator film 36.

The negative electrode pad 38 is constituted by laminating sequentially an Ni layer 38a with the thickness of approximately 20 nm as a barrier layer, a soldering film 38b with a maximum thickness of approximately 10 μm and an Au layer 38c with the thickness of approximately 20 nm as a soldering oxidation preventive layer. The soldering film 38b is constituted of a single metal or a soldering alloy having a melting temperature of 400° C. or less, more specifically, constituted of AuSn alloy, for example.

Furthermore, as shown in FIG. 5A, the positive electrode pad 37 and the negative electrode pad 38 are formed in the same shape as each other when viewed from above. Still furthermore, when the light-emitting device 31 is viewed from the side opposite the transparent substrate 32, the positive electrode pad 37 and the negative electrode pad 38 are positioned so as to be respectively symmetrical. In addition, the positive electrode pad 37 and the negative electrode pad 38 are arranged with a predetermined interval therebetween, and these pads 37 and 38 are arranged in such a manner that their longer sides face each other.

Soldering paste prepared by adding soldering particles to flux paste may be coated on the positive electrode pad 37 and the negative electrode pad 38.

Figure 6A:
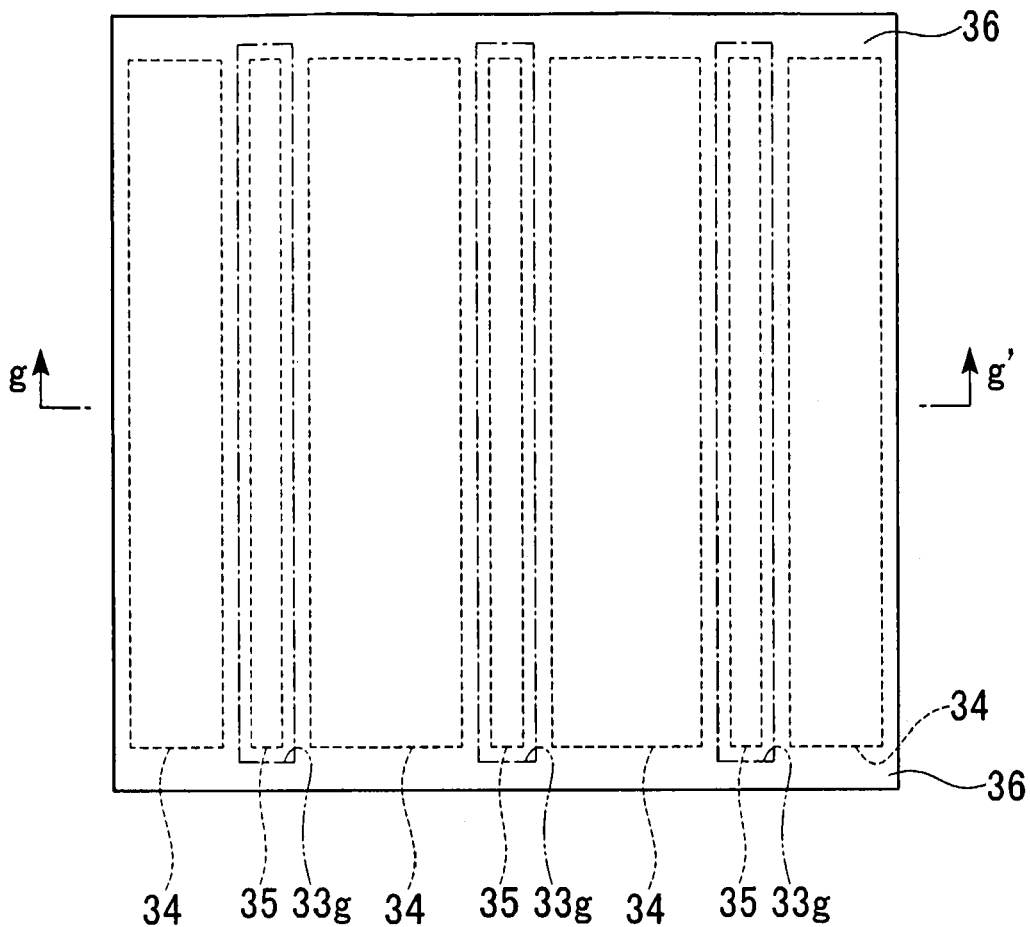
FIG. 6A is a bottom view.
Figure 6B:
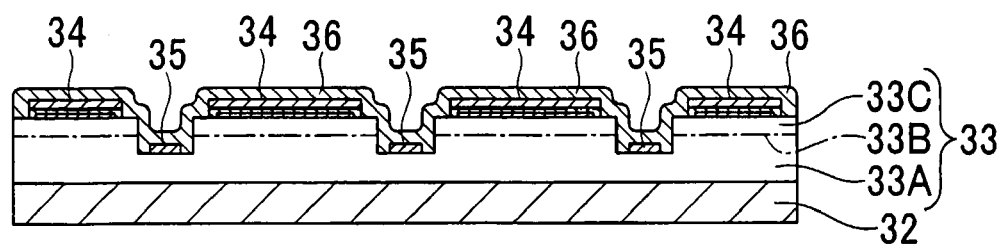
FIG. 6B is a sectional process drawing corresponding to the line g-g' of (A)
Figure 7A:
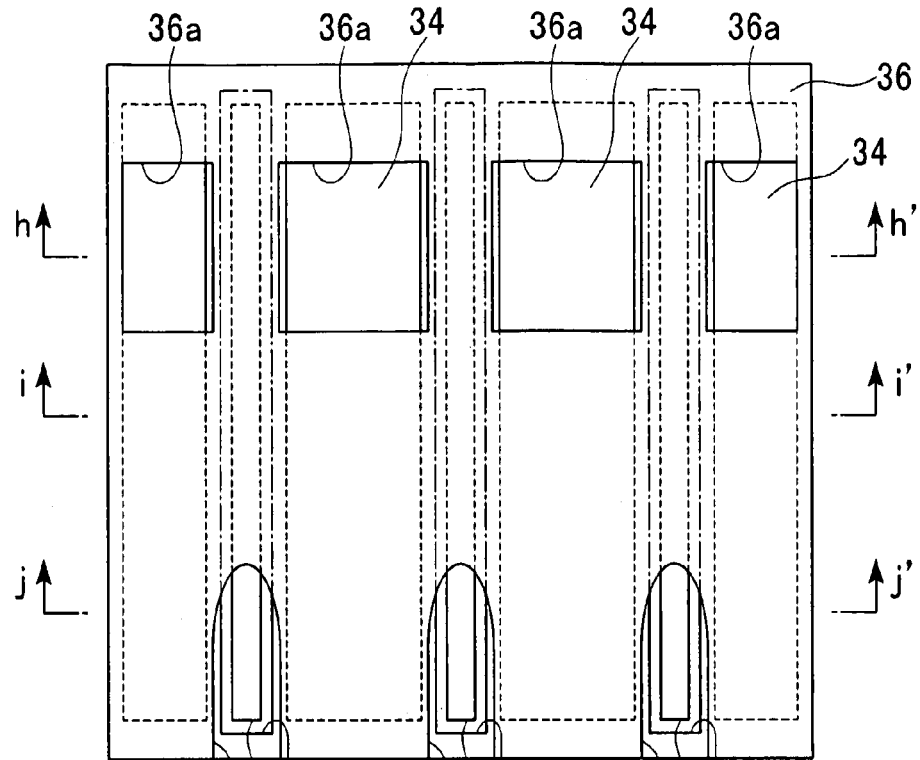
FIG. 7A is a bottom view.
Figure 7B:
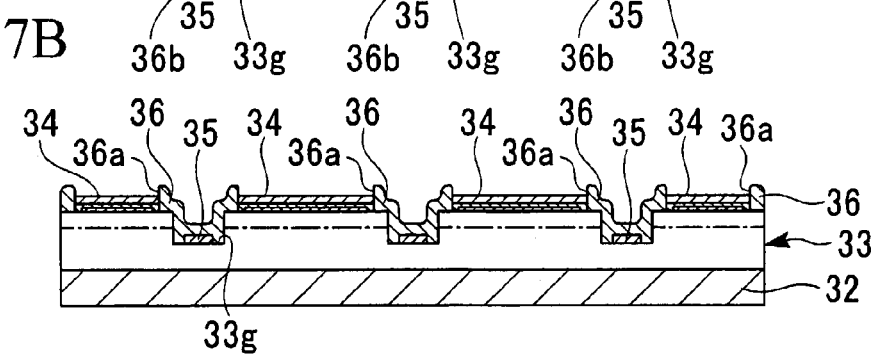
FIG. 7B is a sectional pattern diagram corresponding to the line h-h' of FIG. 7A.
Figure 7C:
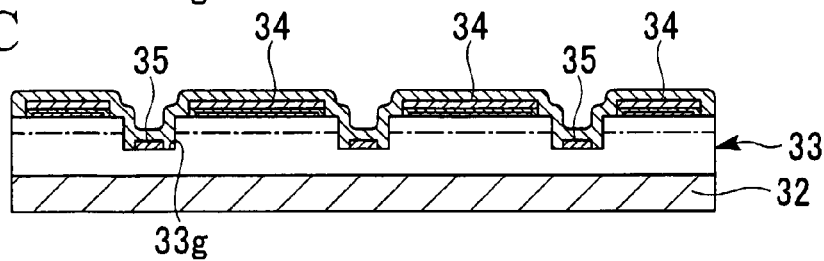
FIG. 7C is a sectional pattern diagram corresponding to the line i-i' of FIG. 7A.
Figure 7D:
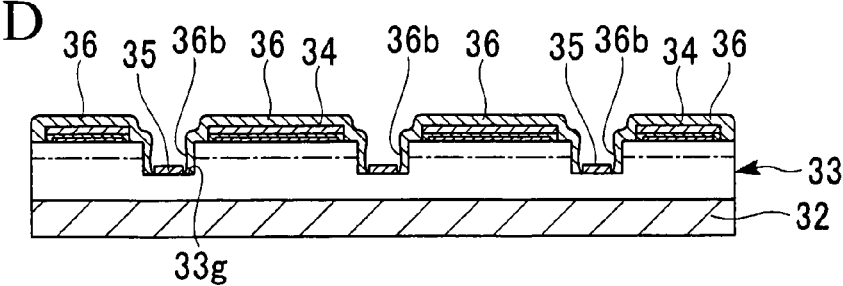
FIG. 7D is a sectional pattern diagram corresponding to the line j-j' of FIG. 7A.
Figure 8A:
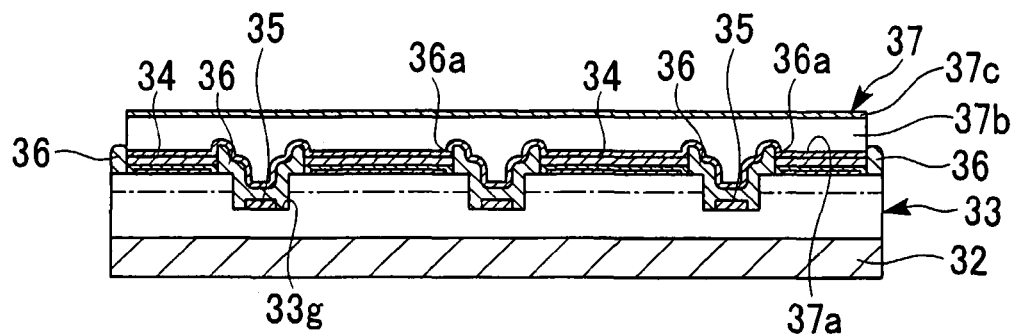
FIG. 8A is a sectional pattern diagram corresponding to FIG. 7B.
Figure 8B:
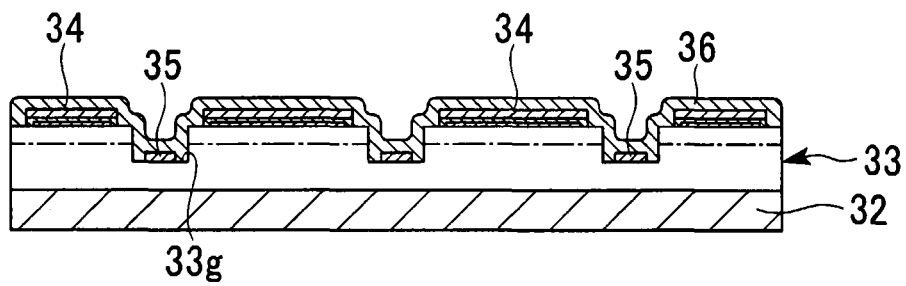
FIG. 8B is a sectional pattern diagram corresponding to FIG. 7C.
Figure 8C:
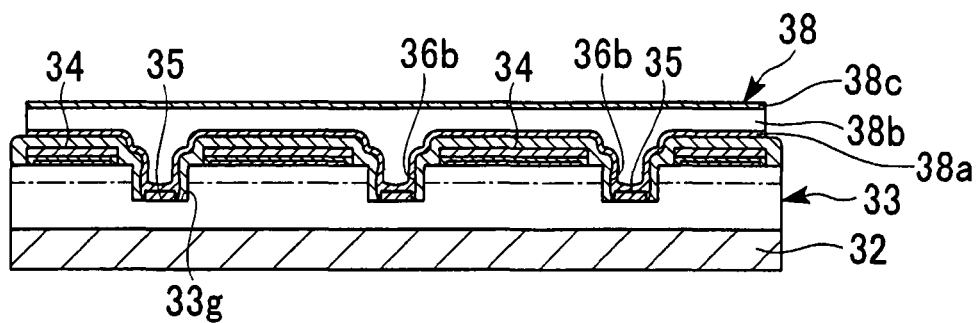
FIG. 8C is a sectional pattern diagram corresponding to FIG. 7D.

FIG. 6 to FIG. 8 illustrate methods for manufacturing the light-emitting device 31 of the present embodiment. FIG. 6 are process drawings describing a method for manufacturing the light-emitting device 31 of the present embodiment in which FIG. 6A is a bottom view, FIG. 6B is a sectional process drawing corresponding to the line g-g' of FIG. 6A. FIG. 7 are process drawings describing a method for manufacturing the light-emitting device 31 in which FIG. 7A is a bottom view, FIG. 7B is a sectional pattern diagram corresponding to the line h-h' of FIG. 7A, FIG. 7C is a sectional pattern diagram corresponding to the line i-i' of FIG. 7A, and FIG. 7D is a sectional pattern diagram corresponding to the line j-j' of FIG. 7A. Furthermore, FIG. 8 are process drawings describing a method for manufacturing the light-emitting device 31 in which FIG. 8A is a sectional pattern diagram corresponding to FIG. 7B, FIG. 8B is a sectional pattern diagram corresponding to FIG. 7C and FIG. 8C is a sectional pattern diagram corresponding to FIG. 7D.

First, as shown in FIG. 6, a semiconductor layer 33 is formed on the transparent substrate 32 by sequentially laminating a contact layer from a buffer layer, the semiconductor layer 33 is partially etched to provide a plurality of recesses 33g, a negative electrode 35 is formed on an n-type semiconductor layer 33A exposed from each of the recesses 33g, and a positive electrode 34 is formed on a p-type semiconductor layer 33C.

Then, as shown in FIG. 6, a short-circuit preventing insulator film 36 composed of $SiO_2$ is formed so as to cover the semiconductor layer 33, the positive electrode 34 and the negative electrode 35. The insulator film 36 may be formed by the sputtering process or plasma CVD process, for example.

Then, as shown in FIG. 7, the insulator film 36 is provided with a through hole 36a and a notched portion 36b. The through hole 36a is formed on each of positive electrodes 34 so as to partially expose each of the positive electrodes 34. In a similar manner, the notched portion 36b is formed on each of the negative electrodes 35 so as to partially expose each of the negative electrodes 35.

Then, as shown in FIG. 8, a barrier layer 37a, a soldering film 37b and a soldering oxidation preventive layer 37c are sequentially stacked on the insulator film 36 to form a positive electrode pad 37. The positive electrode pad 37 is formed so as to be across a forming region of the positive electrode 34 and a forming region of the negative electrode 35 along a through hole 36a. In this instance, the positive electrode pad 37 and the positive electrode 34 are connected to each other via the through hole 36a. On the other hand, the insulator film 36 is stacked on the negative electrode 35 to prevent a short circuit between the positive electrode pad 37 and the negative electrode 35.

In a similar manner, a barrier layer 38a, a soldering film 38b and a soldering oxidation preventive layer 38c are sequentially stacked on the insulator film 36 to form a negative electrode pad 38. The negative electrode pad 38 is formed so as to be across a forming region of the positive electrode 34 and a forming region of the negative electrode 35 along a notched portion 36b. In this instance, the negative electrode pad 38 and the negative electrode 35 are connected to each other via the notched portion 36b. On the other hand, the insulator film 36 is stacked on the positive electrode 34 to prevent a short circuit between the negative electrode pad 38 and the positive electrode 34.

As described so far, in the light-emitting device 31 of the present embodiment, the positive electrode pad 37 for mounting is connected to the positive electrode 34, the negative electrode pad 38 for mounting is connected to the negative electrode 35, the short-circuit preventing insulator film 36 is arranged between the negative electrode pad 38 and the positive electrode 34, and the insulator film 36 is also arranged between the positive electrode pad 37 and the negative electrode 35, by which a higher degree of freedom is given to the shape of the positive electrode pad 37 or the negative electrode pad 38, allowing the shape of the negative electrode pad 38 when viewed from above to coincide with that of the positive electrode pad 37 when viewed from above. Thereby, the self alignment effect can be exerted when the light-emitting device 31 is packaged.

Furthermore, according to the light-emitting device 31 of the present embodiment, the recess 33g is provided partially on the semiconductor layer 33, the negative electrode 35 and the negative electrode pad 38 are arranged on the side opposite the transparent substrate 32 side and also the positive electrode pad 37 is arranged on the side opposite the transparent substrate 32 side, by which the positive electrode pad 37 and the negative electrode pad 38 can be packaged on the printed circuit board when the light-emitting device 31 is packaged on printed circuit board and the like to give a flip-chip structure.

When flip-chip mounting is conducted by placing the light-emitting device 31 of the present embodiment on the printed circuit board 10, first, flux paste is thinly coated on each of electrode patterns 10c and 10c of the printed circuit board 10 by the dispenser process, printing process or others. Next, the light-emitting device 31 is arranged on the printed circuit board 10 in such a manner that the pads 37 and 38 are superimposed respectively on the electrode patterns 10c and 10c, and fixed temporarily by using flux paste. Next, light-emitting device 31 and the printed circuit board 10 are charged into a furnace to effect re-flow, and soldering films 37b and 38b constituting these pads 37 and 38 of the light-emitting device 31 are melted and solidified to form a soldering film, by which the pads 37 and 38 are respectively bonded with the electrode patterns 10c and 10c of the printed circuit board 10.

In this instance as well, the soldering films 37b and 38b for bonding are formed on the positive electrode pad 37 and the negative electrode pad 38 side of the light-emitting device 31, flux paste for temporary fixture is coated on the electrode patterns 10c and 10c side of the printed circuit board 10 to effect re-flow, by which a bonded portion of the light-emitting device 31 with the printed circuit board 10 is less likely to be smeared with excess solder and the like, and a better finish can be given to a soldering film (bonded portion) interposed between the electrode pads 37 and 38 and the electrode patterns 10c and 10c after the re-flow. Furthermore, the necessity for coating flux paste on the positive electrode pad 37 and the negative electrode pad 38 side of the light-emitting device 31 is eliminated, thereby making it possible to reduce the production cost.

Therefore, the light-emitting device 31 of the present embodiment is also able to provide similar effects as those provided by the light-emitting device 1 of the first embodiment.

Furthermore, the above-described mounting methods of (a) through (f) may be used in mounting the light-emitting device 31 of the present embodiment on the printed circuit board 10.

Furthermore, in the light-emitting device 31 of the present embodiment, the positive electrode pad 37 for mounting is connected to the positive electrode 34, the negative electrode pad 38 for mounting is connected to the negative electrode 35, the short-circuit preventing insulator film 36 is arranged between the negative electrode pad 38 and the positive electrode 34, and the insulator film 36 is arranged also between the positive electrode pad 37 and the negative electrode 35, by which a higher degree of freedom is given to the shape of the positive electrode pad 37 or the negative electrode pad 38, allowing the shape of the negative electrode pad 38 when viewed from above to coincide with that of the positive electrode pad 37 when viewed from above. Thereby, the self alignment effect can be exerted when the light-emitting device 31 is packaged.

Fourth Embodiment

Figure 9A:
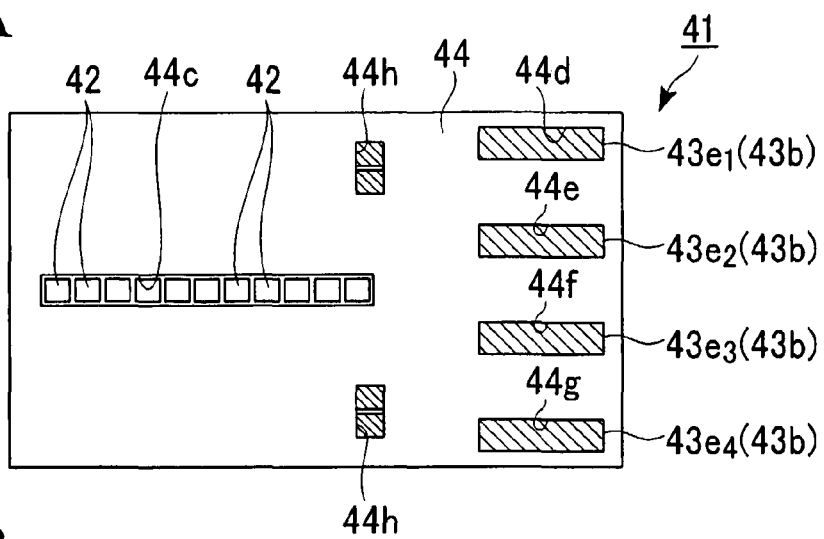
FIG. 9A is a plan pattern diagram.
Figure 9B:
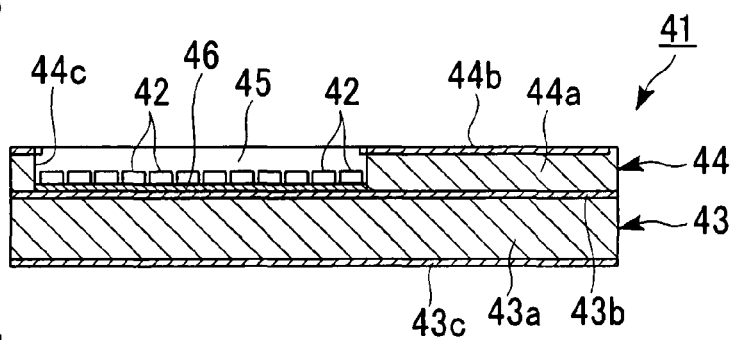
FIG. 9B is a sectional pattern diagram.
Figure 9C:
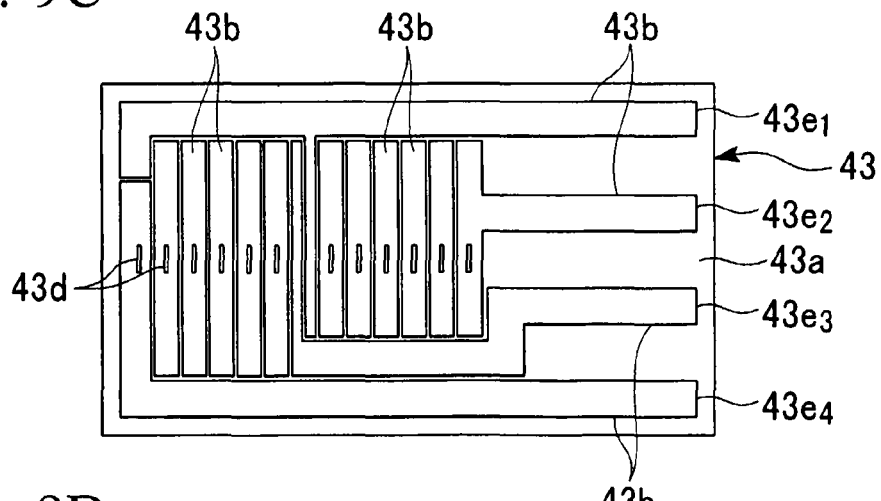
FIG. 9C is a plan pattern diagram of a printed circuit board constituting the light-emitting diode lamp.
Figure 9D:
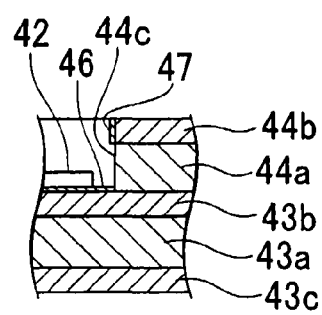
FIG. 9D is a sectional pattern diagram of a major part of the light-emitting diode lamp.

Next, a description will be given of a fourth embodiment of the present invention by referring to the drawings. FIG. 9A is a plan pattern diagram showing the light-emitting diode lamp of the present embodiment. FIG. 9B is a sectional pattern diagram of FIG. 9A. FIG. 9C is a plan pattern diagram showing a printed circuit board for the light-emitting diode lamp. FIG. 9D is a sectional pattern diagram showing a major part of the light-emitting diode lamp.

As shown in FIG. 9A and FIG. 9B, the light-emitting diode lamp 41 of the present embodiment is substantially constituted of a plurality of light-emitting devices 42, a printed circuit board 43 in which these light-emitting devices 42 are packaged and a cover plate 44.

The light-emitting device 42 is preferably of a flip-chip structure provided with a transparent substrate, a semiconductor layer stacked on the transparent substrate, a positive electrode and a negative electrode formed on the side opposite the transparent substrate side of the semiconductor layer, a short-circuit preventing insulator film, a positive electrode pad and a negative electrode pad which are formed in the same shape as each other. More specifically, the light-emitting devices 1, 21 and 31 described in the first to the third embodiments, for example, may be used.

Furthermore, the printed circuit board 43 is substantially constituted of an insulating substrate 43a composed of aluminum oxide, etc., and copper foils 43b and 43c formed on both faces of the insulating substrate 43a. As shown in FIG. 9C, the copper foil 43b formed on one face side of the insulating substrate 43a is patterned to a predetermined pattern shape. The copper foil 43b is patterned, by which electrode patterns 43d corresponding to a positive electrode pad and a negative electrode pad of the light-emitting device 42 are provided. The copper foil 43b is patterned, by which printed patterns $43e_1$ to $43e_4$ for connecting to an external circuit are also provided. The printed patterns $43e_1$ and $43e_2$ are provided as a pair and connected to the electrode pattern 43d, and another printed pattern $43e_3$ and $43e_4$ are provided as a pair and connected to another electrode pattern 43d. On the other hand, the copper foil 43c formed on the other face side of the insulating substrate 43a is, as shown in FIG. 9B, formed all over the other face of the insulating substrate.

Then, as shown in FIG. 9B, the cover plate 44 is constituted of an insulating substrate 44a composed of aluminum oxide etc., and a copper foil 44b formed all over on one face of the insulating substrate 44a. Furthermore, the cover plate 44 is provided with a through hole 44c for exposing the electrode pattern 43d and through holes 44d to 44g for exposing individually printed patterns $43e_1$ to $43e_4$. The light-emitting device 42 is accommodated inside the through hole 44c. Still furthermore, a fluorescent substance-containing transparent resin 45 is filled in the through hole 44c. In addition, the cover plate 44 is provided with other through holes 44h and 44h for partially exposing the printed pattern 43b. A zener diode for electrostatic discharge protection circuit (not illustrated) is attached to these through holes 44h and 44h.

FIG. 9D is an enlarged sectional view showing a peripheral part of the light-emitting device 42. As shown in FIG. 9D and FIG. 9B, a stacked layer 46 formed by sequentially laminating Ni film with a thickness of 0.5 μm and Ag film with a thickness of 20 nm is formed on the electrode pattern 43d exposed from the through hole 44c. Furthermore, a stacked layer 47 constituted in the same manner as the stacked layer 46 is formed on the edge face of the copper foil 44b which opens the through hole 44c.

Twelve pieces of the light-emitting devices 42 are packaged laterally in a line, with the positive electrode pad and the negative electrode pad facing the printed circuit board 43 side. Thereby a so-called flip-chip structure is provided. More specifically, the positive electrode pad and the negative electrode pad of each light-emitting device are respectively bonded with the electrode pattern 43d, providing an in-line arrangement of six pieces each. A clearance between the light-emitting devices 42 on the printed circuit board 43 is set to be approximately 0.1 mm.

In conducting flip-chip mounting by placing each of the light-emitting devices 42 on the printed circuit board 43, first, flux paste is thinly coated on each electrode pattern 43d of the printed circuit board 43 by the dispenser process, printing process or the like. Then, each light-emitting device 42 is arranged on the printed circuit board 43 in such a manner that the positive electrode pad and the negative electrode pad of each light-emitting device 42 are superimposed on the electrode patterns 43d and fixed temporarily by using flux paste. Then, the light-emitting device 42 and the printed circuit board 43 are charged into a furnace to effect re-flow, and a soldering film constituting each pad of the light-emitting device 42 is melted and solidified to form a soldering film, by which each pad is bonded with the electrode patterns 43d of the printed circuit board 43.

In this instance as well, a soldering film for bonding is formed on the positive electrode pad and the negative electrode pad side of each light-emitting device 42, flux paste for temporary fixture is coated on the electrode pattern 43d of the printed circuit board 43 to effect re-flow, by which a bonded portion of the light-emitting device 42 with the printed circuit board 43 is less likely to be smeared with excess solder and the like, and a better finish can be given to the soldering film (bonded portion) interposed between the electrode pad of each light-emitting device 42 and the electrode pattern 43d after the re-flow. Furthermore, the necessity for coating flux paste on the positive electrode pad and the negative electrode pad side of each light-emitting device 42 is eliminated, thereby making it possible to reduce the production cost.

Therefore, the light-emitting diode lamp 41 of the present embodiment is also able to provide similar effects as those provided by the light-emitting device 1 of the first embodiment.

Furthermore, the above-described mounting methods of (a) through (f) may be used in mounting the light-emitting device 42 on the printed circuit board 43 in the light-emitting diode lamp 41 of the present embodiment.

According to the above-described light-emitting diode lamp 41, since a fluorescent substance-containing transparent resin 45 is filled in a through hole 44c, as with the light-emitting diode lamp of the first embodiment, additive color effects of light can be utilized. For example, a blue-light-emitting device is used to constitute a light-emitting diode lamp which emits white light.

Furthermore, since a printed pattern 43d (patterned copper foil 43b) and the edge face of a copper foil 44b respectively exposed from the through hole 44c are provided with stacked layers 46 and 47 composed of Ni film and Ag film and copper foils 43b and 44b are kept covered, it is possible to reflect blue light effectively by the stacked layers 46 and 47 and increase the output of the light-emitting diode lamp 41 by using the light-emitting device 42 which emits blue light in particular.

In manufacturing the light-emitting diode lamp 41 of the present embodiment, the self alignment effect is exerted as with the first embodiment, by which each pad of the light-emitting device 42 can be accurately positioned on the electrode pattern 43d of the printed circuit board 43 on which a slit is made intentionally. As described above, the self alignment effect can be used to bond the light-emitting device 42 with the printed circuit board 43 at a target position in design. In this embodiment in particular, it is possible to control accurately a position at which a plurality of light-emitting devices 42 are packaged and set a clearance between the light-emitting devices 42 to be 0.1 mm±0.01 mm at high density and high accuracy.

Fifth Embodiment

Figure 10A:
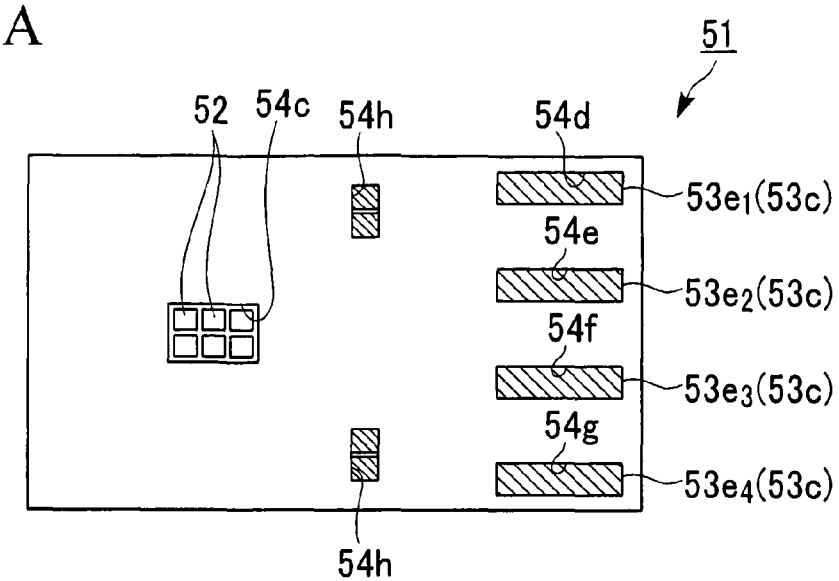
FIG. 10A is a plan pattern diagram.
Figure 10B:
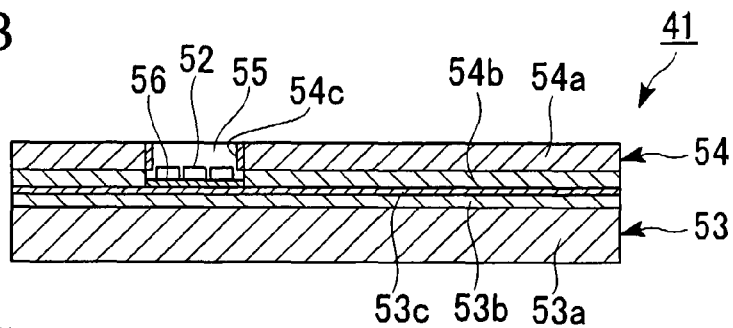
FIG. 10B is a sectional pattern diagram.
Figure 10C:
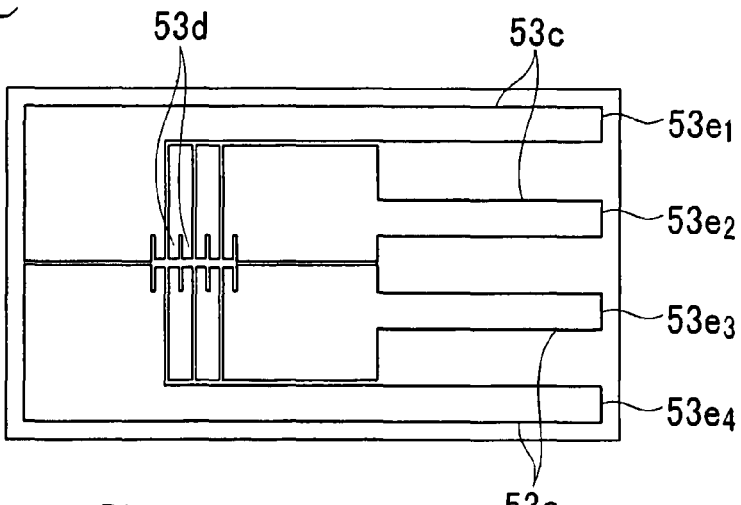
FIG. 10C is a plan pattern diagram of a printed circuit board constituting the light-emitting diode lamp and FIG. 10D is a sectional pattern diagram of a major part of the light-emitting diode lamp.
Figure 10D:
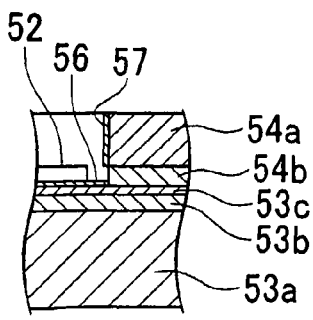
Figure 11A:
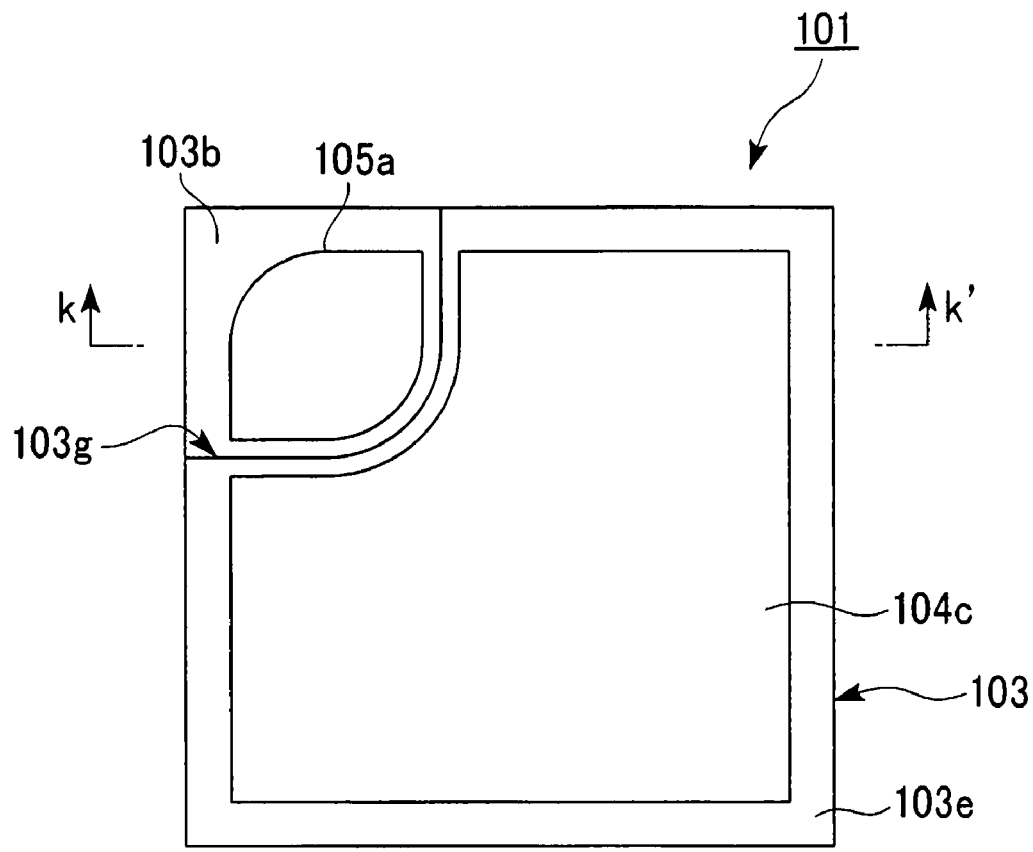
FIG. 11A is a bottom view.
Figure 11B:
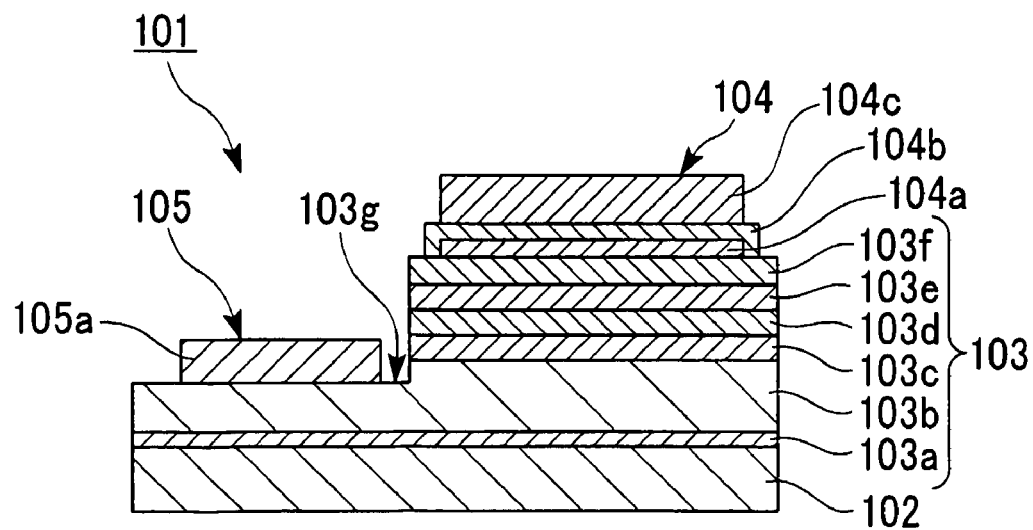
FIG. 11B is a sectional pattern diagram corresponding to the line k-k' of FIG. 11A.

Next, a description will be given of a fifth embodiment of the present invention by referring to the drawings. FIG. 10A is a plan pattern diagram showing the light-emitting diode lamp of the present embodiment. FIG. 10B is a sectional pattern diagram of FIG. 10A. FIG. 10C is a plan pattern diagram showing the printed circuit board for the light-emitting diode lamp. FIG. 10D is a sectional pattern diagram showing a major part of the light-emitting diode lamp.

As shown in FIG. 10A and FIG. 10B, the light-emitting diode lamp 51 of the present embodiment is substantially constituted of a plurality of light-emitting devices 52, a printed circuit board 53 in which these light-emitting devices 52 are packaged and a cover plate 54.

The light-emitting device 52 is preferably of a flip-chip structure provided with a transparent substrate, a semiconductor layer stacked on the transparent substrate, a positive electrode and a negative electrode formed on the side opposite the transparent substrate side of the semiconductor layer, a short-circuit preventing insulator film, a positive electrode pad and a negative electrode pad which are formed in the same shape as each other. More specifically, for example, the light-emitting devices 1, 21, 31 described in the first to the third embodiment may be used.

Furthermore, the printed circuit board 53 is substantially constituted of a metal substrate 53a composed of aluminum, etc., an insulated resin film 53b formed on one face of the metal substrate 53a and a copper foil 53c formed on the insulated resin film 53b. The copper foil 53c is, as shown in FIG. 10C, patterned to a predetermined pattern shape. The copper foil 53c is patterned, by which electrode patterns 53d corresponding to a positive electrode pad and a negative electrode pad of the light-emitting device 52 are provided. The copper foil 53c is patterned, by which printed patterns $53e_1$ to $53e_4$ for connecting to an external circuit are also provided. The printed patterns $53e_1$ and $53e_2$ are provided as a pair and connected to the electrode pattern 53d, and other printed patterns $53e_3$ and $53e_4$ are provided as a pair and connected to another electrode pattern 53d.

Then, as shown in FIG. 10B, the cover plate 54 is constituted of a metal substrate 54a composed of aluminum, etc., and an insulated resin film 54b formed all over on one face of the metal substrate 54a. The insulated resin film 54b is placed to face the copper foil 53c side. Furthermore, the cover plate 54 is provided with a through hole 54c for exposing electrode patterns 53d and through holes 54d to 54g for exposing respectively printed patterns $53e_1$ to $53e_4$. The light-emitting device 52 is accommodated into the through hole 54c. Still furthermore, a fluorescent substance-containing transparent resin 55 is filled in the through hole 54c. In addition, the cover plate 54 is provided with other through holes 54h and 54h for partially exposing the printed pattern 53d. A zener diode for electrostatic discharge protection circuit (not illustrated) is attached to these through holes 54h and 54h.

FIG. 10D is an enlarged sectional view showing a peripheral part of the light-emitting device 52. As shown in FIG. 10D and FIG. 10B, a stacked layer 56 formed by sequentially laminating Ni film with a thickness of approximately 0.5 μm and Ag film with a thickness of 20 nm is formed on the electrode pattern 53d exposed from the through hole 54c. Furthermore, a stacked layer 57 constituted in the same manner as the stacked layer 56 is formed on the edge face of metal substrate 54a which opens the through hole 54c.

In conducting flip-chip mounting by placing each light-emitting device 52 on the printed circuit board 53, first, flux paste is thinly coated on each of electrode patterns 53d of the printed circuit board 53 by the dispenser process, printing process and others. Next, each light-emitting devices 52 is arranged on the printed circuit board 53 in such a manner that the positive electrode pad and the negative electrode pad of each light-emitting device 52 are superimposed on the electrode patterns 53d, and fixed temporarily by using flux paste. Then, the light-emitting device 52 and the printed circuit board 53 are charged into a furnace to effect re-flow, and a soldering film constituting each pad of the light-emitting device 52 is melted and solidified to form a soldering film, by which each pad is bonded with the electrode patterns 53d of the printed circuit board 53.

In this instance as well, a soldering film for bonding is formed on the positive electrode pad and the negative electrode pad side of each light-emitting device 52, flux paste for temporary fixture is coated on the electrode pattern 53d side of the printed circuit board 53 to effect re-flow, by which a bonded portion of the light-emitting device 52 with the printed circuit board 53 is less likely to be smeared with excess solder and the like, and a better finish can be given to the soldering film (bonded portion) interposed between the electrode pad of each light-emitting device 52 and the electrode pattern 53d after the re-flow. Furthermore, the necessity for coating flux paste on the positive electrode pad and the negative electrode pad side of each light-emitting device 52 is eliminated, thereby making it possible to reduce the production cost.

Therefore, the light-emitting diode lamp 51 of the present embodiment is also able to provide similar effects as those provided by the light-emitting device 1 of the first embodiment.

Furthermore, the above-described mounting methods of (a) through (f) may be used in mounting the light-emitting device 52 on the printed circuit board 53 in the light-emitting diode lamp 51 of the present embodiment.

A total of six pieces of the light-emitting devices 52 laterally in two lines each consisting of three pieces are packaged, with the positive electrode pad and the negative electrode pad facing the printed circuit board 53 side. Thereby, a so-called flip-chip structure is provided. More specifically, the positive electrode pad and the negative electrode pad of each light-emitting device are respectively bonded with the electrode patterns 53d. A clearance between the light-emitting devices 52 on the printed circuit board 53 is set to be approximately 0.1 mm.

According to the above light-emitting diode lamp 51, since a fluorescent substance-containing transparent resin 55 is filled in a through hole 54c, as with the light-emitting diode lamp of the fourth embodiment, additive color effects of light can be utilized.

Furthermore, since a printed pattern 53d (patterned copper foil 53c) and the edge face of a metal substrate 54a respectively exposed from the through hole 54c are provided with stacked layers 56 and 57 and a copper foil 53c and an aluminum plate (metal substrate 54a) are kept covered, it is possible to reflect blue light effectively by the stacked layers 56 and 57 and increase the output of the light-emitting diode lamp 51 by using the light-emitting device 52 which emits blue light in particular.

In manufacturing the light-emitting diode lamp 51 of the present embodiment, the self alignment effect is exerted as with the first embodiment, by which each pad of the light-emitting device 52 can be accurately positioned on the electrode pattern 53d of the printed circuit board 53. As described above, the self alignment effect can be used to bond the light-emitting device 52 with the printed circuit board 53 at a target position in design. In this embodiment in particular, it is possible to control accurately a position at which a plurality of light-emitting devices 52 are packaged and set a clearance between the light-emitting devices 52 to be approximately 0.1 mm±0.01 mm at a high density and at a high accuracy.

Sixth Embodiment

Figure 14A:
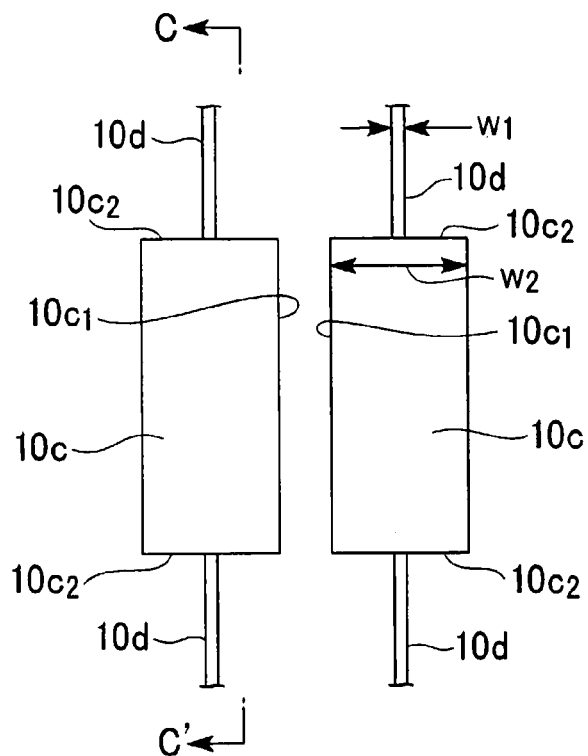
FIG. 14A is a plan pattern diagram showing a major part of the printed circuit board and FIG. 14B is a sectional pattern diagram corresponding to the line c-c' of FIG. 14 A.
Figure 14B:
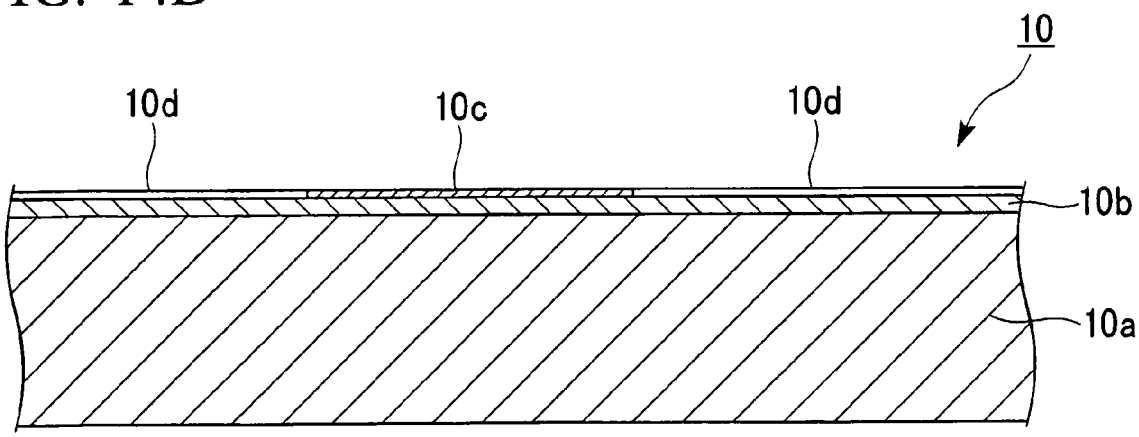

FIG. 14A is a plan pattern diagram showing the printed circuit board of the present embodiment, and FIG. 14B is a sectional pattern diagram corresponding to the line c-c' of FIG. 14A.

As shown in FIG. 14A and FIG. 14B, the printed circuit board 10 is constituted of a metal substrate 10a composed of aluminum, etc., an insulating layer 10b composed of a resin layer stacked on the metal substrate 10a, a pair of electrode patterns 10c and 10c composed of Cu foil formed on the insulating layer 10b and an approximately linear printed pattern 10d connected to each electrode pattern 10c.

The electrode patterns 10c are approximately rectangular when viewed from above, as with each of the pads 7 and 8, so as to correspond to the respective shapes of the positive electrode pad 7 and the negative electrode pad 8 of the light-emitting device 1 when viewed from above. The electrode patterns 10 are formed in the same shape as each other. Furthermore, the electrode patterns 10c and 10c are arranged at predetermined intervals, as with each of the pads 7 and 8, with rectangular longer sides $10c_1$ and $10c_1$ facing each other, in such a manner as to correspond to the positions at which the positive electrode pad 7 and the negative electrode pad 8 of the light-emitting device 1 are formed. Still furthermore, the printed pattern 10d is formed in continuation with each of the electrode patterns 10c and 10c. Thereby, the electrode pattern 10c and the printed pattern 10d are made similar in thickness. The printed pattern 10d is formed with Cu foil, as is the electrode pattern 10c.

Furthermore, as shown in FIG. 14A, two printed patterns 10d are connected to one electrode pattern 10c. Each of the printed patterns 10d is connected to each of shorter sides $10c_2$ of the electrode pattern 10c and drawn out approximately in a vertical direction with respect to the shorter side $10c_2$.

Therefore, two printed patterns 10d are drawn out mutually in the opposite direction with respect to one electrode pattern 10c. The narrower the line width of the printed pattern 10d becomes, the better the printed pattern 10d becomes, where the electric resistance is sufficiently low. This is because low melting-point metals such as solder can be wetted on the electrode pattern 10c in a uniform thickness. The line width $w_1$ of the printed pattern 10d is preferably 200 μm or lower, for example. Furthermore, the ratio of the width $w_1$ of the printed pattern 10d to the length $w_2$ of the shorter side $10c_2$ of the electrode pattern 10c ($w_1/w_2$) becomes more desirable, as it becomes smaller, and the ratio is preferably 1/3 or lower, for example.

The light-emitting device 1 can be packaged on the printed circuit board 10 by using the mounting method described in the first embodiment to obtain similar effects.

Figure 15A:
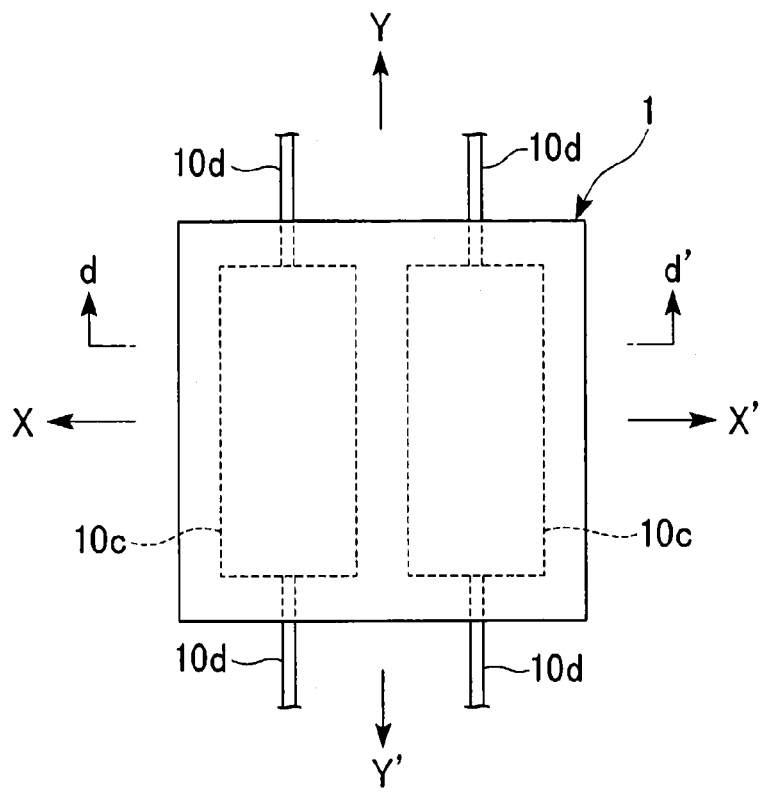
FIG. 15A is a plan pattern diagram and FIG. 15B is a sectional pattern diagram corresponding to the line d-d' of FIG. 15A.
Figure 15B:
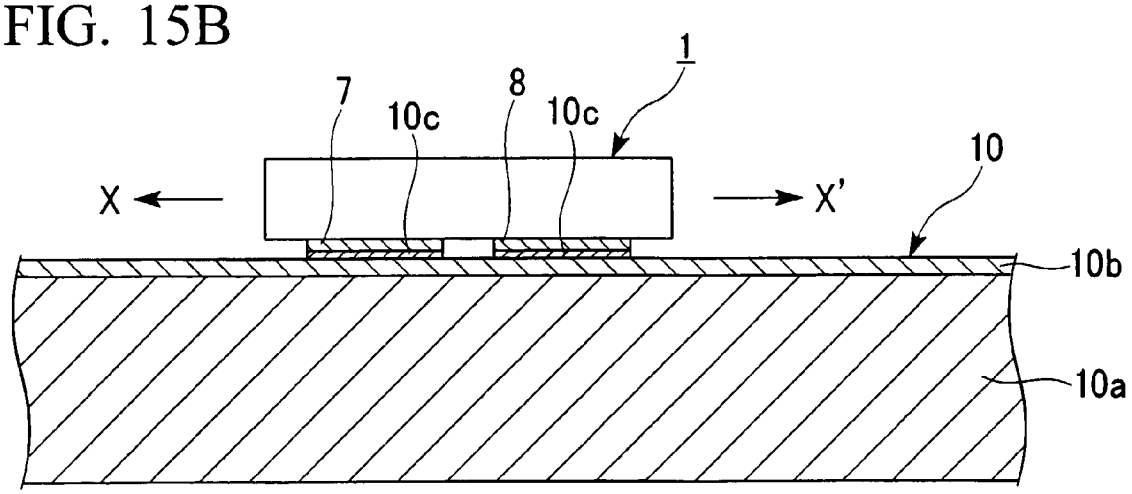

Furthermore, as shown in FIGS. 15A and 15B, in the printed circuit board 10 of the present embodiment, since the printed pattern 10d extends along the Y direction and the Y' direction given in the drawings, melted solder flows along the printed pattern 10d, by which the light-emitting device 1 itself may move in the Y direction or the Y' direction given in the drawing. However, since the printed pattern 10d of the present embodiment is provided with the width $w_1$ ranged as described above, the melted solder is less likely to flow along the printed pattern 10d, thereby eliminating concern that the printed pattern may move away in the Y direction or Y' direction of the light-emitting device 1.

Furthermore, in this embodiment, irrespective of the width $w_1$ of the printed pattern 10d, the ratio of the width $w_1$ to the length $w_2$ of the shorter side $10c_2$ of the electrode pattern 10c ($w_1/w_2$) is set to be 1/3 or lower. Thereby, as described above, the melted solder is less likely to flow along the printed pattern 10d, eliminating concern that the printed pattern may move away in the Y direction or Y' direction of the light-emitting device 1.

As shown in FIGS. 15A and 15B, in the printed circuit board 10 of the present embodiment, since the printed pattern 10d does not extend in the X direction or the X' direction given in the drawings, there is no concern that melted solder may flow in the X direction and the X' direction or the printed pattern may move away in the X direction or the X' direction of the light-emitting device 1 itself.

Seventh Embodiment

Next, a description will be given of a substrate for the light-emitting device which is a seventh embodiment of the present invention by referring to the drawings.

Figure 16A:
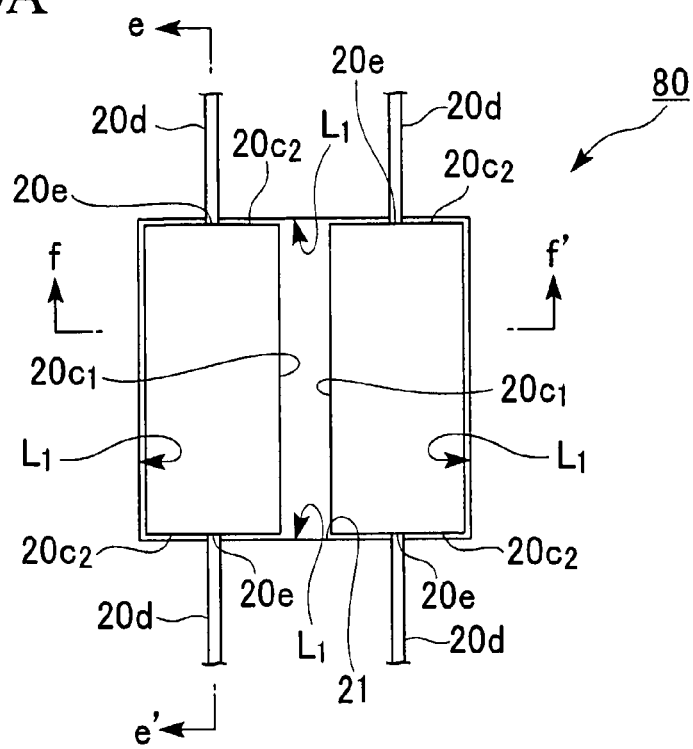
FIG. 16A is a plan pattern diagram showing a major part of the printed circuit board.
Figure 16B:
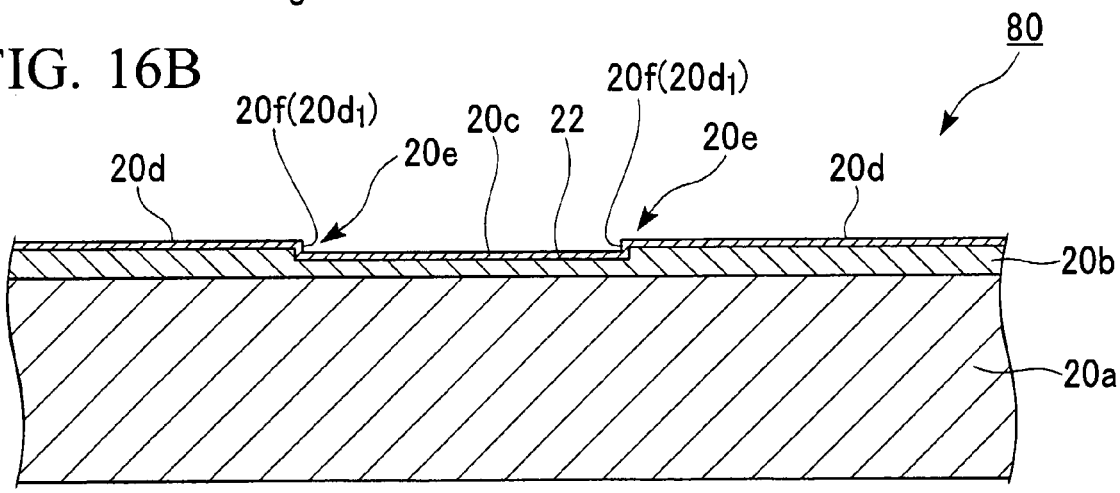
FIG. 16B is a sectional pattern diagram corresponding to the line e-e' of FIG. 16A.
Figure 16C:
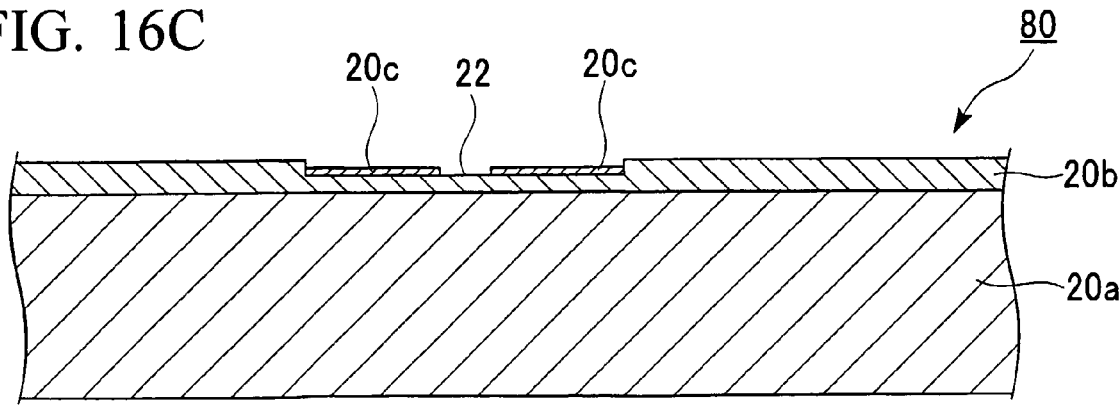
FIG. 16C is a sectional pattern diagram corresponding to the line f-f' of FIG. 16A.

FIG. 16A is a plan pattern diagram showing the printed circuit board of the present embodiment. FIG. 16B is a sectional pattern diagram corresponding to the line e-e' of FIG. 16A. FIG. 16C is a sectional pattern diagram corresponding to the line f-f' of FIG. 16A.

A printed circuit board 80 shown in FIG. 16A to FIG. 16C is substantially constituted of a metal substrate 20a composed of aluminum, etc., an insulating layer 20b composed of a resin layer stacked on the metal substrate 20a, a pair of electrode patterns 20c and 20c composed of Cu foil formed on the insulating layer 20b and an approximately linear printed pattern 20d connected to each of the electrode patterns 20c.

As shown in FIG. 16A, the insulating layer 20b is provided with a recess 22 which is approximately rectangular when viewed from above, the recess 22 is formed by making the insulating layer 20b partially thinner than other parts, with the depth ranging from approximately 10 μm to approximately 500 μm. The above-described electrode pattern 20c is formed in the recess 22.

The recess 22 is not necessarily constituted as described above. For example, a recess is provided on the surface of the metal substrate 20a and an insulating layer of uniform thickness is formed all over the metal substrate 20a including the recess, by which the recess may be provided on the insulating layer, corresponding to the recess of the metal substrate 20a. Alternatively, copper foil may be partially subjected to half-etching to provide the recess.

The electrode pattern 20c is approximately rectangular when viewed from above, as with each of the pads 7 and 8, so as to correspond to the shapes of the positive electrode pad 7 and the negative electrode pad 8 of the light-emitting device 1 when viewed from above, and the electrode patterns 10 are formed in the same shape as each other. Furthermore, each electrode pattern 20c is arranged at predetermined intervals, as with each of the pads 7 and 8, with rectangular longer sides $20c_1$ and $20c_1$ facing each other, in such a manner as to correspond to the positions at which the positive electrode pad 7 and the negative electrode pad 8 of the light-emitting device 1 are formed. Still furthermore, the printed pattern 20d is formed in continuation with each of the electrode patterns 20c and 20c. Thereby, the electrode pattern 20c and the printed pattern 20d are made similar in thickness. The printed pattern 20d is formed with Cu foil, as is the electrode pattern 10c.

Furthermore, as shown in FIG. 16A, of contour lines defining the shape of the electrode pattern when viewed from above, all contour lines excluding the longer sides $20c_1$ and $20c_1$ are in proximity to the contour line $L_1$ defining the shape of the recess 22 when viewed from above. More specifically, shorter sides $20c_2$ and $20c_2$ defining the shape of the electrode pattern 20c when viewed from above are also in proximity to the contour line $L_1$ of the recess 22.

On the other hand, a printed pattern 20d is connected to the electrode pattern 20c, and the printed pattern 20d is connected to each shorter side $20c_2$ of the electrode pattern 20c. Therefore, a connected portion 20e of the electrode pattern 20c with the printed pattern 20d is substantially superimposed on the contour line $L_1$ of the recess 22.

Since the electrode pattern 20c and the printed pattern 20d are formed in continuation with each other, as shown in FIG. 16B, a step portion 20f is provided at the connected portion 20e of the electrode pattern 20c with the printed pattern 20d, and the step portion 20f acts to expose the edge face $20d_1$ of the printed pattern 20d.

Furthermore, as shown in FIG. 16A, two printed patterns 20d are connected to one electrode pattern 20c. Each of the printed patterns 20d is drawn out approximately in a vertical direction with respect to the shorter side $20c_2$ of the electrode pattern 20c. Therefore, two printed patterns 20d are drawn out mutually in the opposite direction with respect to one electrode pattern 20c, by which the single electrode pattern 20c is held between two step portions 20f.

The light-emitting device 1 shown in FIG. 1 can be packaged on the printed circuit board 80 by using the mounting method described in the first embodiment to obtain similar effects.

Figure 17A:
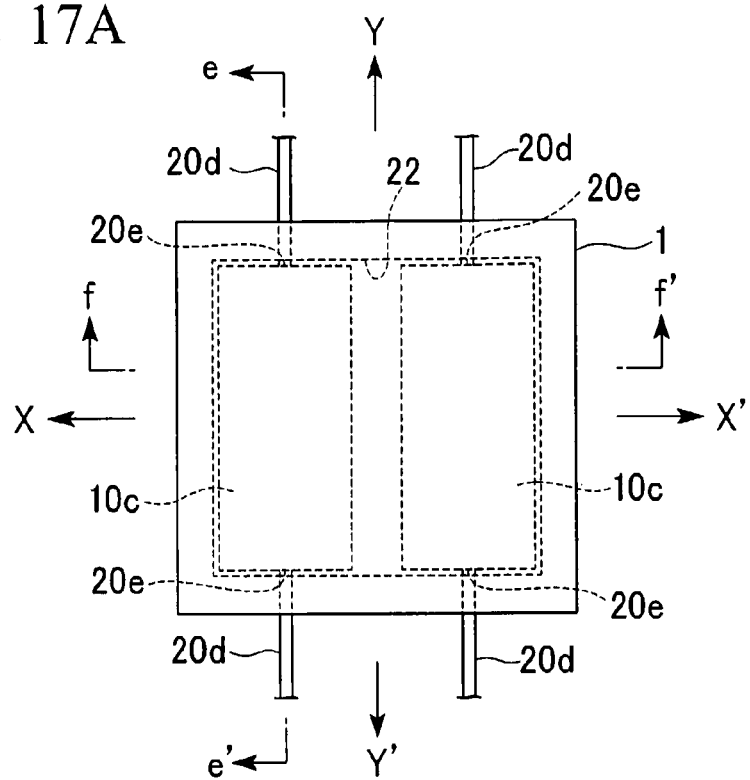
FIG. 17A is a plan pattern diagram.
Figure 17B:
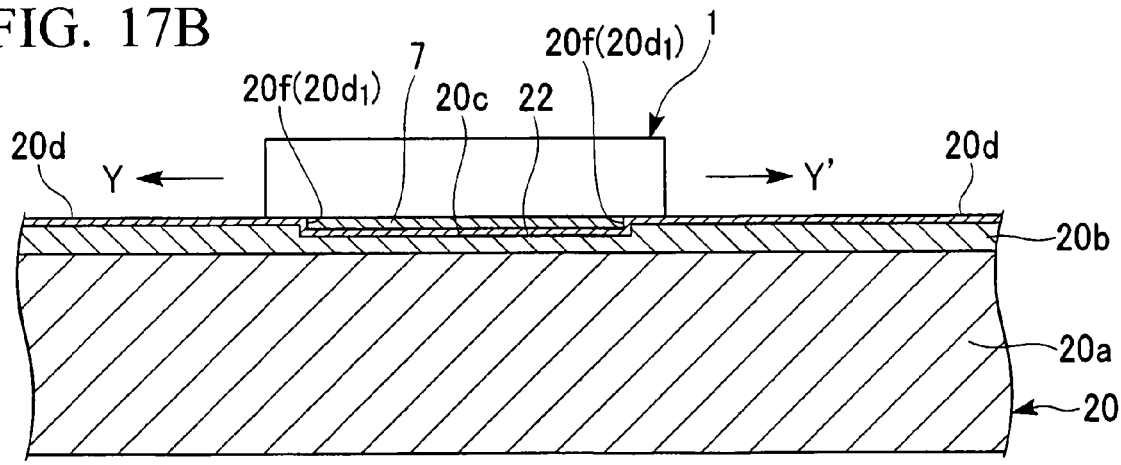
FIG. 17B is a sectional pattern diagram corresponding to the line e-e' of FIG. 17A.
Figure 17C:
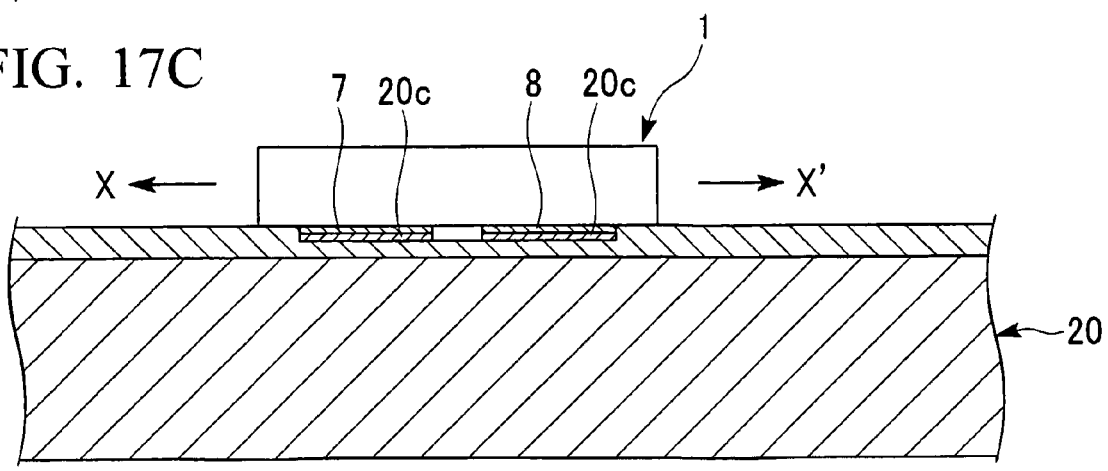
FIG. 17C is a sectional pattern diagram corresponding to the line f-f' of FIG. 17A.

Furthermore, as shown in FIG. 17A and (B), in the printed circuit board 80 of the present embodiment, since the printed pattern 20d extends along the Y direction and the Y' direction given in the drawings, melted solder flows along the printed pattern 20d, by which the light-emitting device 1 itself may move in the Y direction or the Y' direction given in the drawings. However, since the printed pattern 20d of the present embodiment is provided at the connected portion 20e of the electrode pattern 20c with a step portion 20f at which the edge face $20d_1$ is exposed, the melted solder is less likely to flow along the printed pattern 20d due to the presence of the step portion 20d, thereby eliminating concern that the printed pattern may move away in the Y direction or the Y' direction of the light-emitting device 1.

As shown in FIG. 17A and (C), in the printed circuit board 80 of the present embodiment, there is no concern that the melted solder may flow out from the recess 22. Furthermore, since the printed pattern 20d does not extend in the X direction and the X' direction given in the drawings, the melted solder will not flow in the X direction or the X' direction, eliminating concern that the printed pattern may move away in the X direction or the X' direction of the light-emitting device 1.

Furthermore, in the printed circuit board 80 of the present embodiment, as with the sixth embodiment, the line width of the printed pattern 20d may be set to be 200 μm or lower. Still furthermore, as with the sixth embodiment, the ratio of the width of the printed pattern 20d to the length of the shorter side $20c_2$ of the electrode pattern 20c may be set to be 1/3 or lower.

Eight Embodiment (One Example of the Light-emitting Diode Lamp)

Figure 18A:
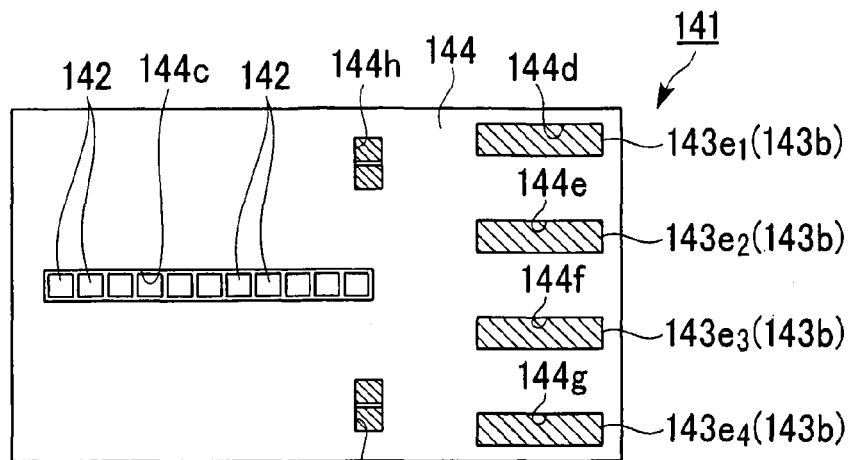
FIG. 18A is a plan pattern diagram.
Figure 18B:
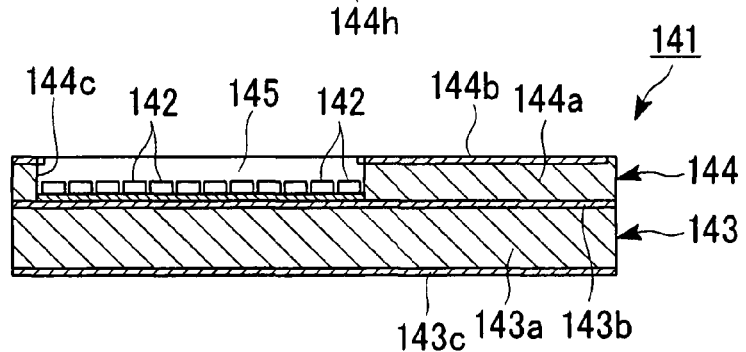
FIG. 18B is a sectional pattern diagram.
Figure 18C:
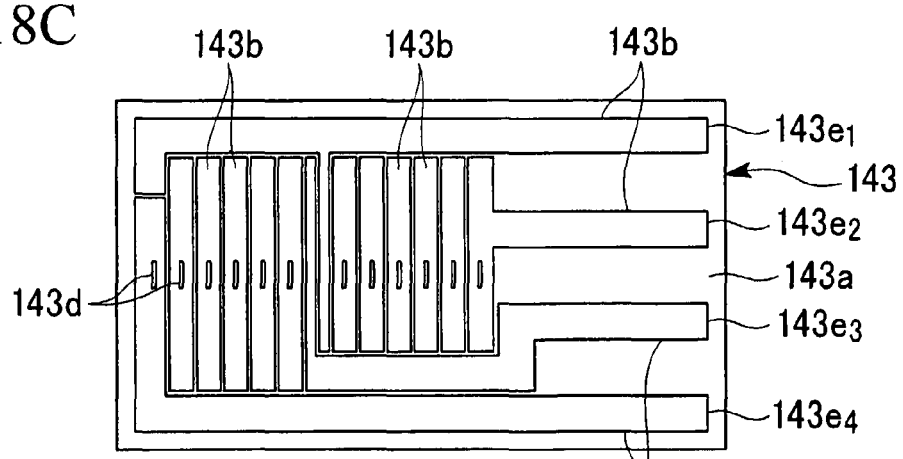
FIG. 18C is a plan pattern diagram of a printed circuit board constituting the light-emitting diode lamp and FIG. 18D is a sectional pattern diagram of a major part of the light-emitting diode lamp.
Figure 18D:
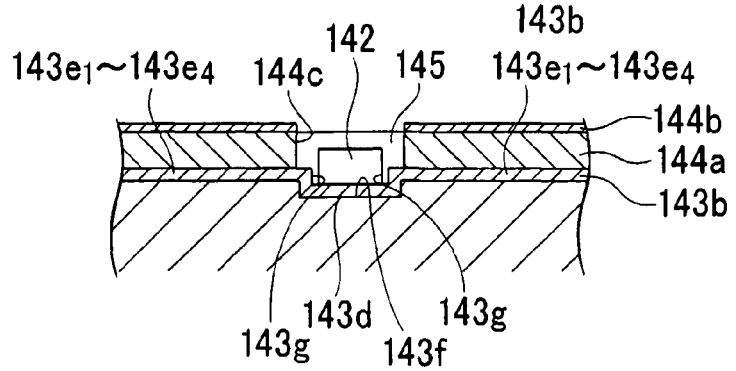

Next, a description will be given of an eighth embodiment of the present invention by referring to the drawings. FIG. 18A is a plan pattern diagram showing the light-emitting diode lamp of the present embodiment. FIG. 18B is a sectional pattern diagram of FIG. 18A. FIG. 18C is a plan pattern diagram showing the printed circuit board for the light-emitting diode lamp. FIG. 18D is a sectional pattern diagram showing a major part of the light-emitting diode lamp.

As shown in FIG. 18A and FIG. 18B, the light-emitting diode lamp 141 of the present embodiment is substantially constituted of a plurality of light-emitting devices 142, a printed circuit board 143 in which these light-emitting devices 142 are packaged and a cover plate 144.

The light-emitting device 142 is preferably of a flip-chip structure provided with a transparent substrate, a semiconductor layer stacked on the transparent substrate, a positive electrode and a negative electrode formed on the side opposite the transparent substrate side of the semiconductor layer, a short-circuit preventing insulator film, a positive electrode pad and a negative electrode pad which are formed in the same shape as each other. More specifically, for example, the above-described light-emitting devices 1, 21 and 31 may be used.

Furthermore, the printed circuit board 143 is substantially constituted of an insulating substrate 143a composed of aluminum oxide, etc., and copper foils 143b and 143c formed on both faces of the insulating substrate 143a. As shown in FIG. 18C, the copper foil 143b formed on one face side of the insulating substrate 143a is patterned to a predetermined pattern shape. The copper foil 143b is patterned, by which electrode patterns 143d corresponding to the positive electrode pad and the negative electrode pad of the light-emitting device 142 are provided. The copper foil 143b is patterned, by which printed patterns $143e_1$ to $143e_4$ for connecting to an external circuit are also provided. The printed patterns $143e_1$ and $143e_2$ are given as a pair and connected to the electrode pattern 143d, and another printed pattern $143e_3$ and $143e_4$ are given as a pair and connected to another electrode pattern 143d. On the other hand, the copper foil 143c formed on the other face side of the insulating substrate 143a is, as shown in FIG. 18B, formed all over the other face of the insulating substrate.

As shown in FIG. 18D, the electrode pattern 143d is arranged inside a recess 143f provided on the printed circuit board 143. A step portion 143g is formed between the electrode pattern 143d and printed patterns $143e_1$ to $143e_4$ by the recess 143f.

Then, the light-emitting device 142 is fitted into a space between the step portions 143g and 143g.

Then, as shown in FIG. 18B, the cover plate 144 is constituted of an insulating substrate 144a composed of aluminum oxide, etc., and a copper foil 144b formed all over the face of the insulating substrate 144a. Furthermore, the cover plate 144 is provided with a through hole 144c for exposing the electrode pattern 143d and through holes 144d to 144g for exposing individually printed patterns $143e_1$ to $143e_4$. The light-emitting device 142 is accommodated inside the through hole 144c. Furthermore, a fluorescent substance-containing transparent resin 145 is filled in the through hole 144c. Still furthermore, the cover plate 144 is provided with other through holes 144h and 144h for partially exposing the printed pattern 143b. A zener diode for electrostatic discharge protection circuit (not illustrated) is attached to these through holes 144h and 144h.

Figure 12A:
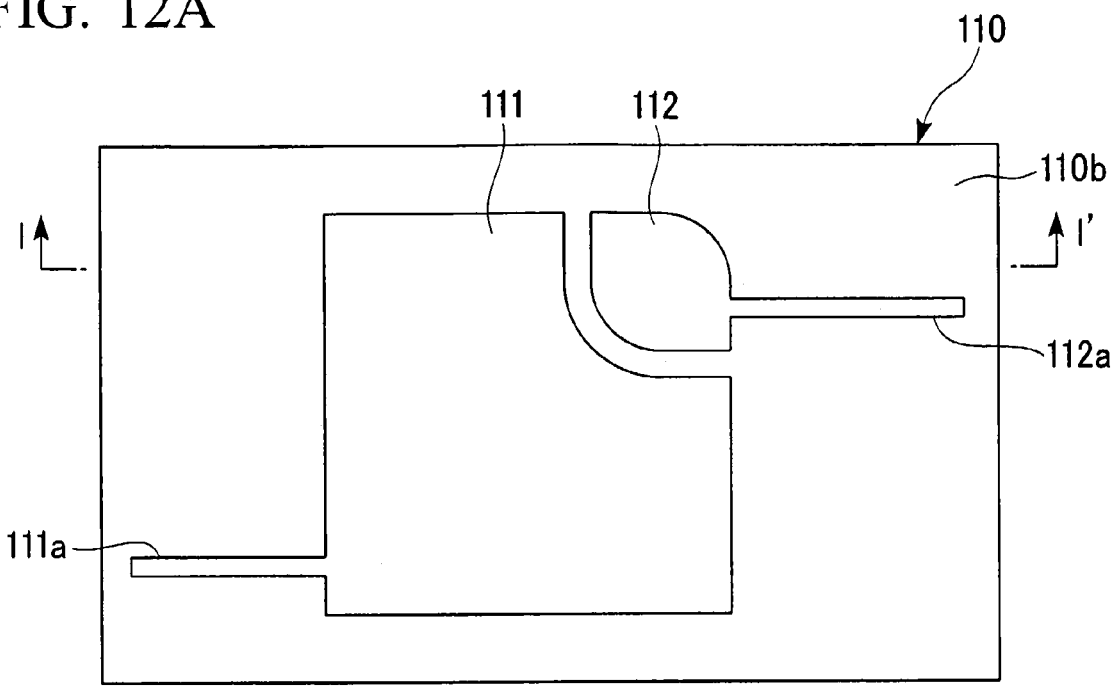
FIG. 12A is a plan pattern diagram.
Figure 12B:
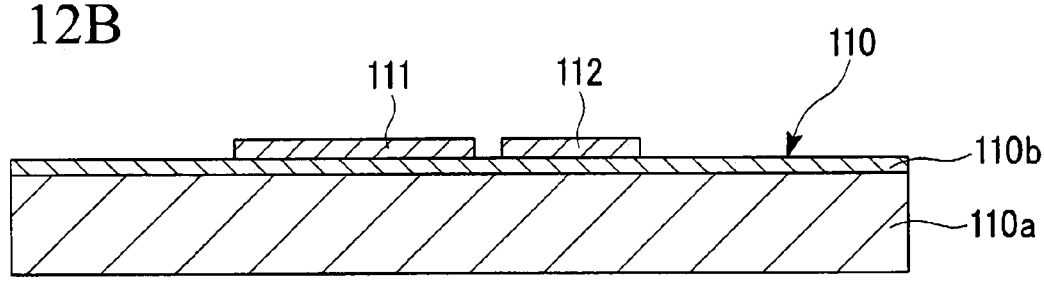
FIG. 12B is a sectional pattern diagram corresponding to the line l-l' of FIG. 12A.
Figure 13:
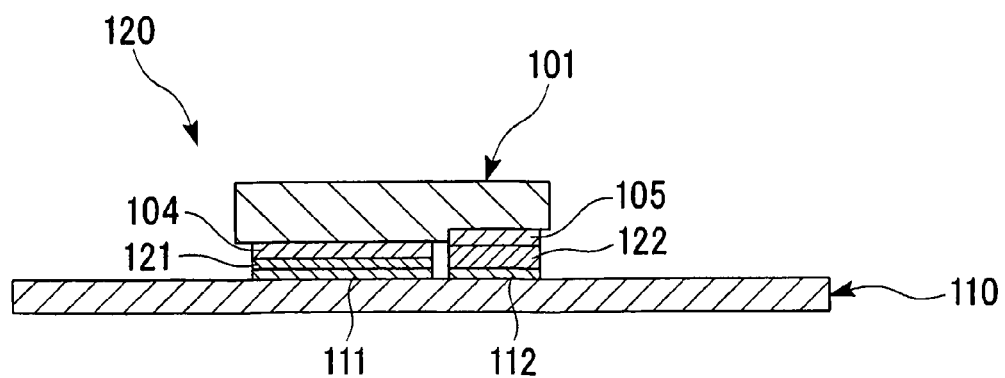
FIG. 13 is a sectional pattern diagram showing the light-emitting diode lamp.

Furthermore, as shown in FIG. 18D and FIG. 18B, 12 pieces of the light-emitting devices 142 are packaged laterally in one line, with the positive electrode pad and the negative electrode pad facing the printed circuit board 143 side. Thereby a so-called flip-chip structure is provided. More specifically, the positive electrode pad and the negative electrode pad of each light-emitting device are respectively bonded with the electrode pattern 143d, giving an in-line arrangement by six pieces each. A clearance between the light-emitting devices 142 on the printed circuit board 143 is set to be approximately 0.1 mm.

According to the above light-emitting diode lamp 141, since a fluorescent substance-containing transparent resin 145 is filled in a through hole 144c, additive color effects of light can be utilized. For example, blue-light-emitting devices are used to constitute a light-emitting diode lamp which emits white light.

Furthermore, a step portion 143g is formed between the electrode pattern 143d and printed patterns $143e_1$ to $143e_4$, and the light-emitting device 142 is fitted into a space between the step portions 143g and 143g. Therefore, as with the above-described embodiment, the self alignment effect is exerted to package the light-emitting devices 142 as designed.

Ninth Embodiment (Another Example of Light-emitting Diode Lamp)

Figure 19A:
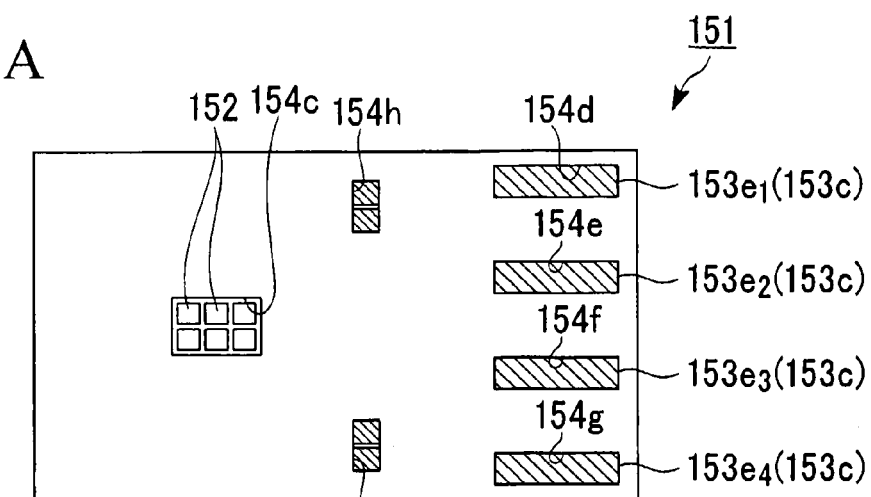
FIG. 19A is a plan pattern diagram.
Figure 19B:
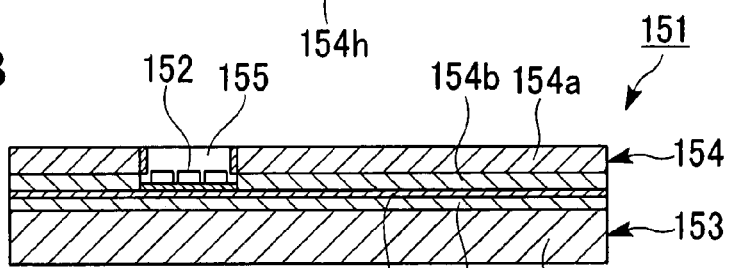
FIG. 19B is a sectional pattern diagram.
Figure 19C:
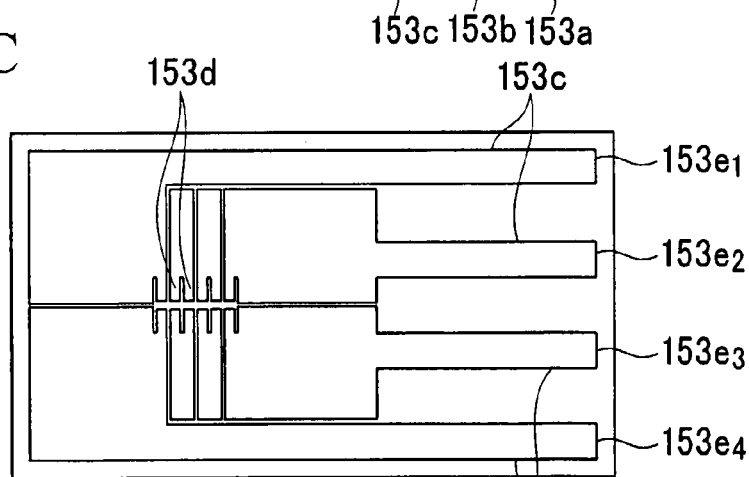
FIG. 19C is a plan pattern diagram of a printed circuit board constituting the light-emitting diode lamp.
Figure 19D:
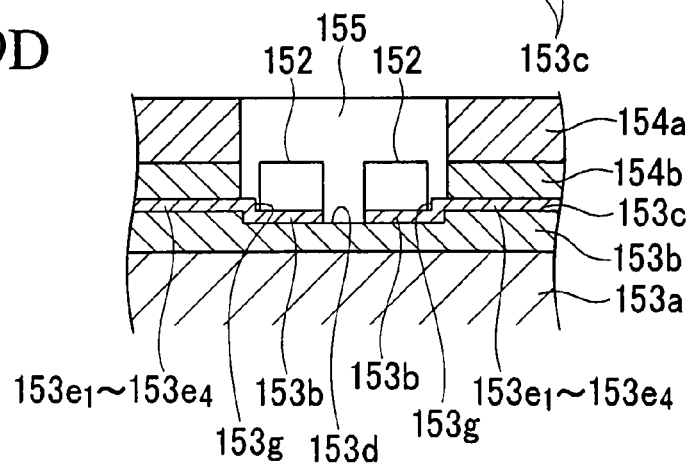
FIG. 19D is a sectional pattern diagram of a major part of the light-emitting diode lamp.

Next, a description will be given of a ninth embodiment of the present invention by referring to the drawings. FIG. 19A is a plan pattern diagram showing the light-emitting diode lamp of the present embodiment. FIG. 19B is a sectional pattern diagram of FIG. 19A. FIG. 19(C) is a plan pattern diagram showing the printed circuit board for the light-emitting diode lamp. FIG. 19(D) is a sectional pattern diagram showing a major part of the light-emitting diode lamp.

As shown in FIG. 19A and FIG. 19B, the light-emitting diode lamp 151 of the present embodiment is substantially constituted of a plurality of light-emitting devices 152, a printed circuit board 153 in which these light-emitting devices 152 are packaged and a cover plate 154.

The light-emitting device 152 is preferably of a flip-chip structure provided with a transparent substrate, a semiconductor layer stacked on the transparent substrate, a positive electrode and a negative electrode formed on the side opposite the transparent substrate side of the semiconductor layer, a short-circuit preventing insulator film, a positive electrode pad and a negative electrode pad which are formed in the same shape as each other. More specifically, for example, the above-described light-emitting devices 1, 21 and 31 may be used.

Furthermore, the printed circuit board 153 is substantially constituted of a metal substrate 153a composed of aluminum, etc., an insulated resin film 153b formed on one face of the metal substrate 153a and copper foil 153c formed on the insulated resin film 153b. As shown in FIG. 19C, the copper foil 153c is patterned to a predetermined pattern shape. The copper foil 153c is patterned, by which electrode patterns 153d corresponding to the positive electrode pad and the negative electrode pad of the light-emitting device 152 are provided. Furthermore, the copper foil 153c is patterned, by which printed patterns $153e_1$ to $153e_4$ for connecting to an external circuit are also provided. The printed patterns $153e_1$ and $153e_2$ are given as a pair and connected to the electrode pattern 153d, and other printed patterns $153e_3$ and $153e_4$ are given as a pair and connected to another electrode pattern 153d.

As shown in FIG. 19D, the electrode pattern 153d is arranged inside a recess 153f provided on the printed circuit board 153. A step portion 153g is formed between the electrode pattern 153d and printed patterns $153e_1$ to $153e_4$ by the recess 153f.

Then, the light-emitting device 152 is positioned by the step portion 143g.

Then, as shown in FIG. 19B, the cover plate 154 is constituted of a metal substrate 154a composed of aluminum, etc., and an insulated resin film 154b formed all over on one face of the metal substrate 154a. The insulated resin film 154b is placed to face the copper foil 153c side. Furthermore, the cover plate 154 is provided with a through hole 154c for exposing the electrode pattern 153d and through holes 154d to 154g for respectively exposing printed patterns $153e_1$ to $153e_4$. The light-emitting device 152 is accommodated inside the through hole 154c. Furthermore, a fluorescent substance-containing transparent resin 155 is filled in the through hole 154c. Still furthermore, the cover plate 154 is provided with other through holes 154h and 154h for partially exposing the printed pattern 153d. A zener diode for electrostatic discharge protection circuit (not illustrated) is attached to these through holes 154h and 154h.

A total of six pieces of the light-emitting devices 152 are packaged laterally in two lines by three pieces each, with the positive electrode pad and the negative electrode pad facing the printed circuit board 153. Thereby a so-called flip-chip structure is provided. More specifically, the positive electrode pad and the negative electrode pad of each light-emitting device are respectively bonded with the electrode pattern 153d. A clearance between the light-emitting devices 152 on the printed circuit board 153 is set to be approximately 0.1 mm.

According to the above light-emitting diode lamp 151, since a fluorescent substance-containing transparent resin 155 is filled in a through hole 154c, additive color effects of light can be provided.

Furthermore, since a printed pattern 153d (patterned copper foil 153c) and the edge face of a metal substrate 154a respectively exposed from the through hole 54c are provided with stacked layers 156 and 157, and the copper foil 153c and the aluminum plate (metal substrate 154a) are kept covered, it is possible to reflect blue light effectively by the stacked layers 156 and 157 and increase the output of the light-emitting diode lamp 151 in using the light-emitting device 152 which emits blue light in particular.

Furthermore, a step portion 153g is formed between the electrode pattern 153d and printed patterns $153e_1$ to $153e_4$, and the light-emitting device 152 is positioned by the step portion 153g. Therefore, as with the above-described embodiment, the self alignment effect is exerted to package the light-emitting device 152 as designed.

A detailed description has been so far made for the present invention by referring to the embodiments. The technical scope of the present invention shall not be restricted to the above embodiments but may be modified in various ways without departing from the gist of the present invention.

For example, the light-emitting device should not be restricted to a gallium nitride-type semiconductor light-emitting device alone but may be applied to other types of light-emitting devices. Furthermore, materials, dimensions and others of the members constituting light-emitting devices, etc., are only referred to as examples in describing the embodiments, and they may be changed appropriately within the scope of the present invention. Furthermore, the shape and positional relationship of the positive electrode and negative electrode shall not be restricted within the scope of these embodiments but may be changed whenever appropriate. Still furthermore, the shape of the electrode pad and the negative electrode pad when viewed from above shall not be restricted to a rectangle but may be a square, a triangle or a rectangle with round corners.

The invention claimed is:

1. A flip-chip type semiconductor light-emitting device comprising:
    a transparent substrate;
    a semiconductor layer in which an n-type semiconductor layer, a light-emitting layer and a p-type semiconductor layer are sequentially stacked on the transparent substrate;
    a negative electrode bonded with the n-type semiconductor layer formed on the side opposite the transparent substrate side of the semiconductor layer;
    a positive electrode formed on the side opposite the transparent substrate side of the semiconductor layer, bonded with the p-type semiconductor layer and larger in electrode area than the negative electrode; and
    a positive electrode pad and a negative electrode pad, which are respectively connected to the positive electrode and the negative electrode,
    wherein each of the electrode pads has the same shape as each other, when viewed from above, and
    a recess penetrating the light-emitting layer and the p-type semiconductor layer to partially expose the n-type semiconductor layer is provided at a plurality of sites on the side opposite the transparent substrate side of the semiconductor layer, a plurality of the negative electrodes are individually bonded with the n-type semiconductor layer exposed from each of the recesses, a plurality of the positive electrodes are bonded with the p-type semiconductor layer adjacent to each of the recesses, each of the electrode pads is respectively formed across a forming region of the plurality of the negative electrodes and a forming region of the plurality of the positive electrodes, and a short-circuit preventing insulator film is provided respectively between adjacent ones of the positive electrode pad and the negative electrode and between adjacent ones of the negative electrode pad and the positive electrode.

2. A flip-chip type semiconductor light-emitting device according to claim 1, wherein the short-circuit preventing insulator film is formed on all of the positive electrode, the negative electrode and the semiconductor layer, the insulator film is provided with an aperture for connecting the negative electrode with the negative electrode pad and also provided with another aperture for connecting the positive electrode to the positive electrode pad.

3. A flip-chip type semiconductor light-emitting device according to claim 1, wherein soldering particles-containing soldering paste is coated respectively on the positive electrode pad and the negative electrode pad.

4. A flip-chip type semiconductor light-emitting device according to claim 1, wherein a soldering film is included respectively in the positive electrode pad and the negative electrode pad.

5. A method for manufacturing a flip-chip type semiconductor light-emitting device as claimed in claim 1, wherein with regard to a semiconductor light-emitting device comprising a transparent substrate, a semiconductor layer in which, an n-type semiconductor layer, a light-emitting layer and a p-type semiconductor layer are sequentially stacked on the transparent substrate, a negative electrode formed on the side opposite the transparent substrate side of the semiconductor layer and bonded with the n-type semiconductor layer, and a positive electrode formed on the side opposite the transparent substrate side of the semiconductor layer, bonded with the p-type semiconductor layer and larger in electrode area than the negative electrode, a short-circuit preventing insulator film is formed at least partially on a forming region of the positive electrode,
    a negative electrode pad is formed from a forming region of the negative electrode to a forming region of the insulator film, the negative electrode pad is connected to the negative electrode, and a positive electrode pad which is formed in the same shape as the negative electrode pad is connected to the positive electrode.

6. A method for manufacturing the flip-chip type semiconductor light-emitting device according to claim 5, wherein a recess penetrating the light-emitting layer and the p-type semiconductor layer to partially expose the n-type semiconductor layer is provided on the side opposite the transparent substrate side of the semiconductor layer, the negative electrode is bonded with the thus exposed n-type semiconductor layer, the positive electrode is bonded with the p-type semiconductor layer, and
    the positive electrode pad is formed at a remaining portion of the forming region of the positive electrode.

7. A method for manufacturing the flip-chip type semiconductor light-emitting device according to claim 5, wherein a recess penetrating the light-emitting layer and the p-type semiconductor layer to partially expose the n-type semiconductor layer is provided at a plurality of sites on the side opposite the transparent substrate side of the semiconductor layer, a plurality of the negative electrodes are individually bonded with the n-type semiconductor layer exposed from each of the recesses, a plurality of the positive electrodes are bonded with the p-type semiconductor layer adjacent to each of the recesses, the short-circuit preventing insulator film is formed on the semiconductor layer, a plurality of the positive electrodes and a plurality of the negative electrodes, the insulator film is provided with a plurality of apertures to expose partially a plurality of the negative electrodes and a plurality of the positive electrode, the positive electrode pad and the negative electrode pad are formed respectively across a forming region of a plurality of the negative electrodes and a forming region of a plurality of the positive electrodes, the positive electrode pad is connected to the positive electrode and the negative electrode is connected to the positive electrode respectively via the apertures, and the insulator film is used to insulate respectively a space between the positive electrode pad and the negative electrode and a space between the negative electrode pad and the positive electrode.

8. A mounting structure of a flip-chip type semiconductor light-emitting device which is provided with the flip-chip type semiconductor light-emitting device described in claim 1 and a printed circuit board having electrode patterns corresponding respectively to the positive electrode pad and the negative electrode pad of the flip-chip type semiconductor light-emitting device, wherein the positive electrode pad and the negative electrode pad are connected to each of the electrode patterns.

9. A mounting structure of the flip-chip type semiconductor light-emitting device according to claim 8, wherein a plurality of the flip-chip type semiconductor light-emitting devices are connected in series.

10. A light-emitting diode lamp which is provided with the mounting structure described in claim 8.

11. A method for mounting the flip-chip type semiconductor light-emitting device according to claim 4, wherein flux paste is coated on each electrode pattern of the printed circuit board having electrode patterns corresponding respectively to the positive electrode pad and the negative electrode pad, the semiconductor light-emitting device is arranged on the printed circuit board in such a manner that the positive electrode pad and the negative electrode pad are superimposed respectively on the electrode patterns, and fixed temporarily by the flux paste, and re-flow is then effected to melt and solidify the soldering film, by which the positive electrode pad and the negative electrode pad are respectively bonded with the electrode patterns.

12. A method for mounting the flip-chip type semiconductor light-emitting device according to claim 11, wherein a soldering film is formed on each of the electrode patterns, and the flux paste is coated on the soldering film.

13. A method for mounting the flip-chip type semiconductor light-emitting device according to claim 11, wherein soldering particles are contained in the flux paste.

14. A mounting structure of the flip-chip type semiconductor light-emitting device which is provided with the flip-chip type semiconductor light-emitting device described in claim 4 and a printed circuit board having electrode patterns corresponding respectively to the positive electrode pad and the negative electrode pad of the semiconductor light-emitting device, the semiconductor light-emitting device is arranged on the printed circuit board in such a manner that the positive electrode pad and the negative electrode pad are superimposed respectively on the electrode patterns, and the positive electrode pad and the negative electrode pad are respectively bonded with the electrode patterns via a soldering film formed by melting and solidifying the soldering film.

15. A printed circuit board on which the flip-chip type semiconductor light-emitting device described in claim 1 is packaged, the printed circuit board for the flip-chip type semiconductor light-emitting device comprising a pair of electrode patterns to which each of the electrode pads is connected on mounting and a printed pattern connected to the electrode patterns, wherein a pair of the electrode patterns are formed in the same shape as each other when viewed from above.

16. A printed circuit board for the flip-chip type semiconductor light-emitting device described in claim 15, wherein a plurality of printed patterns are connected to one of the above electrode patterns, a step portion for exposing the edge face of the printed pattern is provided at a connected portion of the electrode pattern with the printed pattern.

17. A printed circuit board for the flip-chip type semiconductor light-emitting device described in claim 16, wherein a plurality of the printed patterns are formed approximately in a linear manner, and each of the printed patterns is drawn out from a pair of the electrode patterns in a mutually different direction.

18. A printed circuit board for the flip-chip type semiconductor light-emitting device according to claim 15, wherein the printed pattern is formed approximately in a linear manner and the line width of the printed pattern is 500 μm or lower.

\* \* \* \* \*